(12) United States Patent
Ichinose et al.

(10) Patent No.: US 7,800,105 B2
(45) Date of Patent: Sep. 21, 2010

(54) GA$_2$O$_3$ SEMICONDUCTOR DEVICE

(75) Inventors: Noboru Ichinose, Tokyo (JP); Kiyoshi Shimamura, Tokyo (JP); Kazuo Aoki, Tokyo (JP); Encarnacion Antonia Garcia Villora, Tokyo (JP)

(73) Assignee: Waseda University, Tokyo (JP)

( * ) Notice: Subject to any disclaimer, the term of this patent is extended or adjusted under 35 U.S.C. 154(b) by 875 days.

(21) Appl. No.: 10/592,533

(22) PCT Filed: Jan. 14, 2005

(86) PCT No.: PCT/JP2005/000421

§ 371 (c)(1),
(2), (4) Date: Dec. 8, 2006

(87) PCT Pub. No.: WO2005/088735

PCT Pub. Date: Sep. 22, 2005

(65) Prior Publication Data

US 2008/0142795 A1    Jun. 19, 2008

(30) Foreign Application Priority Data

Mar. 12, 2004  (JP) .............................. 2004-071816

(51) Int. Cl.
*H01L 23/48*  (2006.01)
*H01L 21/44*  (2006.01)

(52) U.S. Cl. .................. 257/43; 257/744; 257/E21.156; 257/E23.163; 257/E29.143; 438/104; 438/602; 438/685

(58) Field of Classification Search .................. 257/43, 257/744, E21.156, E23.163, E29.143; 438/104, 438/602, 685
See application file for complete search history.

(56) References Cited

U.S. PATENT DOCUMENTS 5,960,014 A    9/1999  Li et al.

(Continued)

FOREIGN PATENT DOCUMENTS

JP    6-216367    8/1994

(Continued)

OTHER PUBLICATIONS

Japanese Office Action dated Nov. 15, 2008 with Partial English-Language Translation.

(Continued)

*Primary Examiner*—Evan Pert
(74) *Attorney, Agent, or Firm*—McGinn IP Law Group, PLLC

(57) ABSTRACT

To provide a Ga$_2$O$_3$ compound semiconductor device in which a Ga$_2$O$_3$ system compound is used as a semiconductor, which has an electrode having ohmic characteristics adapted to the Ga$_2$O$_3$ system compound, and which can make a heat treatment for obtaining the ohmic characteristics unnecessary.

An n-side electrode 20 including at least a Ti layer is formed on a lower surface of an n-type β-Ga$_2$O$_3$ substrate 2 by utilizing a PLD method. This n-side electrode 20 has ohmic characteristics at 25° C. The n-side electrode 20 may have two layer including a Ti layer and an Au layer, three layers including a Ti layer, an Al layer and an Au layer, or four layers including a Ti layer, an Al layer, a Ni layer and an Au layer.

6 Claims, 27 Drawing Sheets

U.S. PATENT DOCUMENTS

| | | |
|---|---|---|
| 6,177,292 B1 | 1/2001 | Hong et al. |
| 6,921,928 B2 | 7/2005 | Sonobe |
| 6,977,397 B2 | 12/2005 | Ichinose et al. |
| 7,319,249 B2 | 1/2008 | Ichinose et al. |
| 2004/0007708 A1 | 1/2004 | Ichinose et al. |
| 2004/0195579 A1 | 10/2004 | Sonobe |
| 2006/0001031 A1 | 1/2006 | Ichinose et al. |

FOREIGN PATENT DOCUMENTS

| | | |
|---|---|---|
| JP | 06-216367 | 8/1994 |
| JP | 9-237703 | 9/1997 |
| JP | 09-237703 | 9/1997 |
| JP | 11-1399 | 1/1999 |
| JP | 2001-85743 | 3/2001 |
| JP | 2004-6718 | 1/2004 |
| JP | 2004-6991 | 1/2004 |
| JP | 2004-22933 | 1/2004 |
| JP | 2004-56098 | 2/2004 |
| JP | 2004-056109 | 2/2004 |
| JP | 2004-71657 | 3/2004 |

OTHER PUBLICATIONS

Japanese Office Action dated Jul. 24, 2008 with Partial English-Language Translation.

International Search Report dated Apr. 12, 2005.

Harwig, T. et al., "Electrical properties of B-Ga2O3 single crystals. II", In: Journal of Solid State Chemistry, Jan. 15, 1978, vol. 23, pp. 205-211.

Frank, J. et al., "Electrical doping of gas-sensitive, semiconducting Ga2O3 thin film", In: Sensors and Actuators B: Chemical, Aug. 1996, vol. 34, pp. 373 to 377.

Ueda, N. et al., "Synthesis and control of conductivity of ultraviolet transmitting B-Ga2O3 single crystals", In: Applied Physics Letters, Jun. 30, 1997, vol. 70, Issue 26, pp. 3561 to 3563.

Tomm, Y. et al., "Floating zone growth of B-Ga2O3: A new window material for optoelectronic device applications", In: Solar Energy Materials & Solar Cells, Feb. 2001, vol. 66, pp. 369-374.

Japanese Office Action dated Dec. 22, 2009 (with English translation).

$Ga_2O_3$ SEMICONDUCTOR DEVICE

TECHNICAL FIELD

The present invention relates to a $Ga_2O_3$ semiconductor device (herein also called "$Ga_2O_3$ system semiconductor element") for use in an LED (light emitting diode), an LD (laser diode) or the like and, more particularly, to a $Ga_2O_3$ system compound semiconductor in which a $Ga_2O_3$ system compound is used as a semiconductor, which has an electrode having ohmic characteristics adapted to the $Ga_2O_3$ system compound, and which can make a heat treatment for obtaining the ohmic characteristics unnecessary.

BACKGROUND ART

Heretofore, a light emitting element using a nitride semiconductor, especially, a gallium nitride (GaN) compound semiconductor is used in a light emitting device such as an LED or an LD (for example, refer to a patent document 1).

The patent document 1 describes a GaN blue light emitting element in which a buffer layer, an n-type gallium nitride system compound semiconductor layer, an n-type cladding layer, an n-type active layer, a p-type cladding layer, and a p-type contact layer are deposited on a sapphire substrate. This conventional GaN blue light emitting element emits a light with an emission wavelength of 370 nm.

Patent document 1: Japanese Patent No. 2778405 (FIG. 1)

DISCLOSURE OF THE INVENTION

Problem to be Solved by the Invention

However, with the conventional GaN blue light emitting element, it is difficult to obtain a light emitting element which emits a light in an ultraviolet region having a shorter wavelength due to a band gap. Then, in recent years, $Ga_2O_3$ has been expected as a material which may emit a light in an ultraviolet region because it has a larger band gap.

It is therefore a first object of the present invention to provide a $Ga_2O_3$ system semiconductor element in which a $Ga_2O_3$ system compound is used as a semiconductor, and which has an electrode having ohmic characteristics adapted to the $Ga_2O_3$ system compound.

In addition, it is a second object of the present invention to provide a $Ga_2O_3$ system semiconductor element which can make a heat treatment for obtaining ohmic characteristics unnecessary.

Means for Solving Problem

In order to attain the above-mentioned first object, the first invention provides a $Ga_2O_3$ system semiconductor element, characterized by including: an n-type layer made of a $Ga_2O_3$ compound semiconductor having an n-type conductive (i.e., conductivity) property; and an electrode formed of a Ti layer and formed on the n-type layer.

In order to attain the above-mentioned second object, the second invention provides a $Ga_2O_3$ system semiconductor element in which an electrode is formed on an n-type layer made of a $Ga_2O_3$ compound semiconductor having an n-type conductive (i.e., conductivity) property, characterized in that: the electrode is formed without performing a heat treatment for obtaining ohmic characteristics.

EFFECTS OF THE INVENTION

According to the $Ga_2O_3$ system semiconductor element of the first invention, a contact resistance between the n-type layer made of the $Ga_2O_3$ compound semiconductor and the Ti layer as the electrode becomes small because of the excellent crystallinity of the $Ga_2O_3$ compound semiconductor. Thus, the $Ga_2O_3$ system semiconductor element can have the ohmic characteristics adapted to the $Ga_2O_3$ system compound semiconductor.

According to the $Ga_2O_3$ system semiconductor element of the second invention, a contact resistance between the n-type layer made of the $Ga_2O_3$ compound semiconductor and the Ti layer as the electrode becomes small because of the excellent crystalline of the $Ga_2O_3$ compound semiconductor. Thus, the heat treatment for obtaining the ohmic characteristics can be made unnecessary.

DESCRIPTION OF REFERENCE NUMERALS

Figure 1:
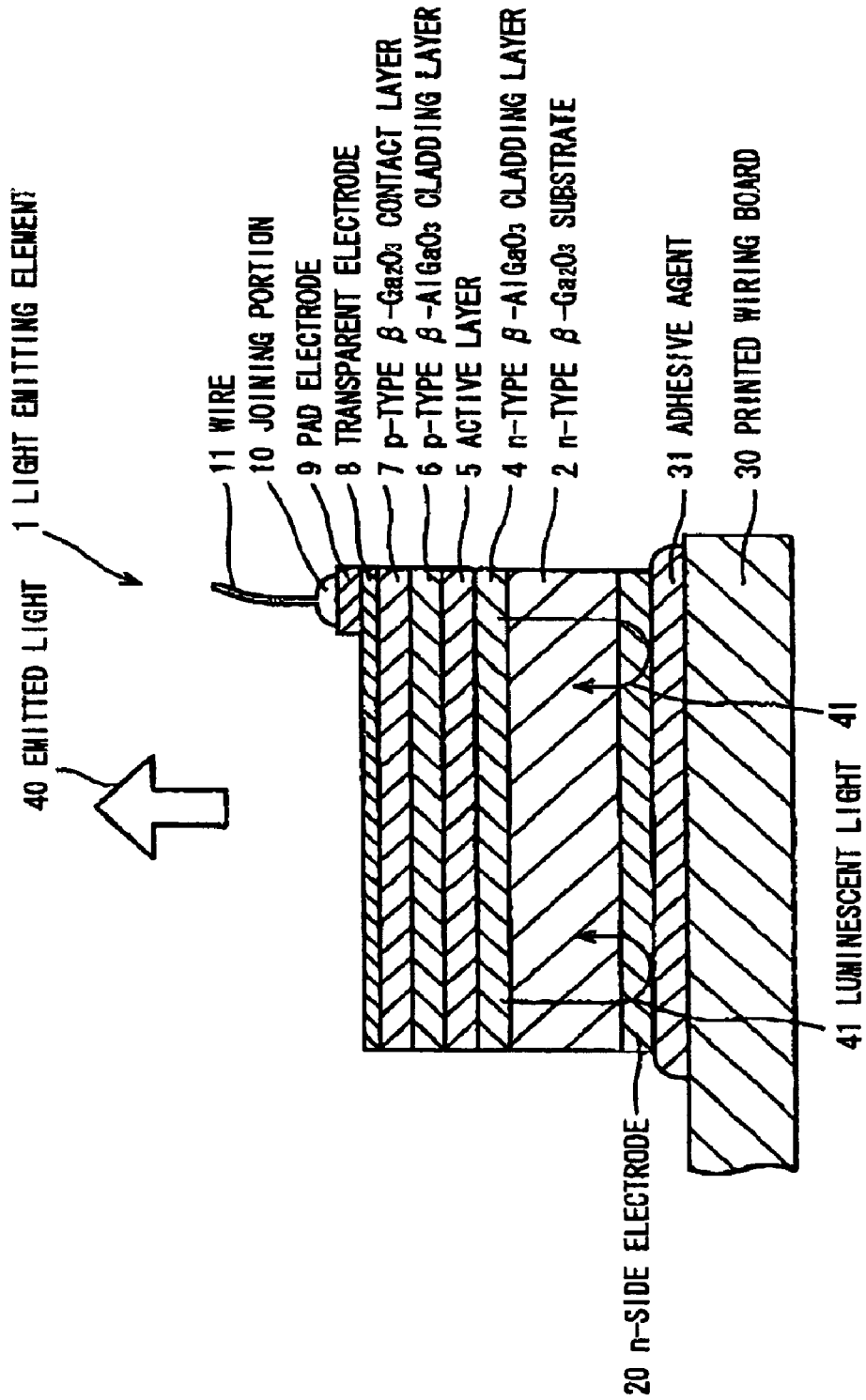
FIG. 1 is a cross sectional view showing a light emitting element according to a first embodiment of the present invention.

1: light emitting element
2: substrate
4: n-type β-AlGaO$_3$ cladding layer
5: active layer
6: p-type β-AlGaO$_3$ cladding layer
7: p-type β-Ga$_2$O$_3$ contact layer
8: transparent electrode
9: pad electrode
10, 12: joining portion
11, 13: wire
20: n-side electrode
21: Ti layer
22: Au layer
23: Al layer
24: Ni layer
30: printed wiring board
31: adhesive agent
40: emitted light
41: luminescent light

BEST MODE FOR CARRYING OUT THE INVENTION

First Embodiment

FIG. 1 shows a light emitting element according to a first embodiment of the present invention. In this light emitting element 1, an n-type β-AlGaO$_3$ cladding layer 3, made of a β-AlGaO$_3$ compound semiconductor, showing an n-type conductive property, an active layer 5 made of β-Ga$_2$O$_3$, a p-type β-AlGaO$_3$ cladding layer 6 showing a p-type conductive property, and a p-type β-Ga$_2$O$_3$ contact layer 7, made of a β-Ga$_2$O$_3$ compound semiconductor, showing a p-type conductive property, are deposited in order on an n-type β-Ga$_2$O$_3$ substrate made of a β-Ga$_2$O$_3$ compound semiconductor.

In addition, this light emitting element 1 includes a transparent electrode 8 formed on the p-type β-Ga$_2$O$_3$ contact layer 7, a pad electrode 9 which is formed as a thin film made of Pt, which is formed on a part of the transparent electrode 8, and to which a wire 11 is connected through a joining portion 10, and an n-side electrode 20 formed on a lower surface of the n-type β-Ga$_2$O$_3$ substrate 2.

The n-side electrode 20, for example, is formed as a thin film made of Ti, and is connected to a printed wiring board 30 having a printed pattern (not shown) formed thereon through an adhesive agent 31.

In addition, the light emitting element 1 is installed on the printed wiring board 30 through the adhesive agent 31 or a metal paste and is connected to a printed wiring of the printed wiring board 30.

Each of the layers 4 to 7 constituting the light emitting element 1, for example, is formed by utilizing a pulsed laser deposition (PLD) method of irradiating a laser beam to a metal target to grow a metal film released from the metal target on the substrate in lean oxygen ambient.

According to the first embodiment, the n-side electrode 20 has desirable ohmic characteristics with the n-type β-Ga$_2$O$_3$ substrate 2. For this reason, since the contact resistance can be reduced, there are obtained the excellent emission characteristics that it is possible to prevent degradation of the electrode due to generation or the like due to a current loss or of the Joule heat in the electrode portion, and deterioration of the characteristics of the compound semiconductor laser or the LED.

Second Embodiment

Figure 2:
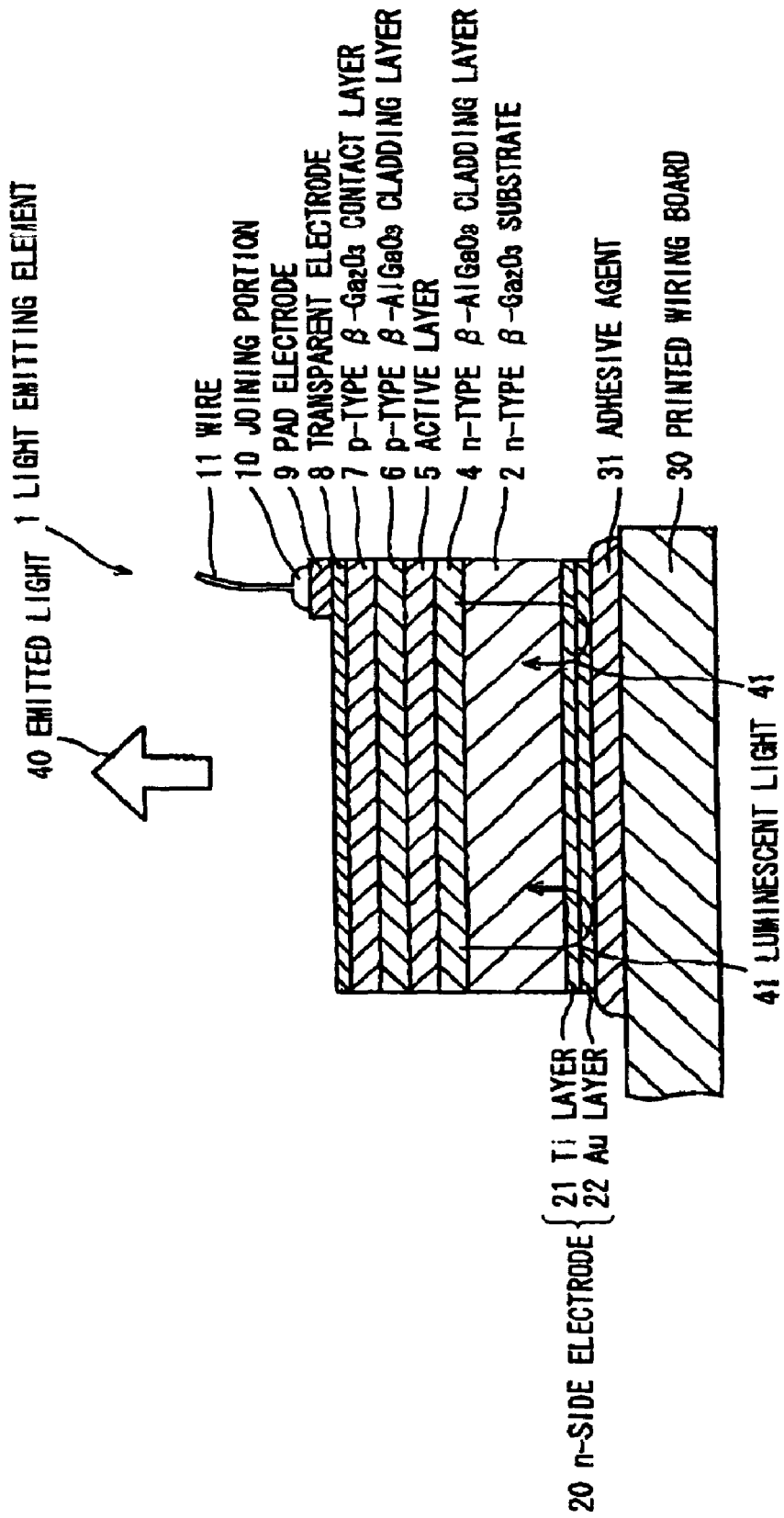
FIG. 2 is a cross sectional view showing a light emitting element according to a second embodiment of the present invention.

FIG. 2 is a view showing a light emitting element according to a second embodiment of the present invention. This light emitting element 1 is different only in the n-side electrode 20 from the light emitting element 1 according to the first embodiment. In the n-side electrode 20 of the light emitting element 1, a Ti layer 21 is formed on a lower surface of the n-type β-Ga$_2$O$_3$ substrate 4, and an Au layer 22 is formed under the Ti layer 21. A Pt layer may be used instead of the Au layer 22.

According to the second embodiment, the n-side electrode 20 has the desirable ohmic characteristics with the n-type β-Ga$_2$O$_3$ substrate 2. For this reason, since the small contact resistance can be obtained between the n-side electrode 20 and the n-type β-Ga$_2$O$_3$ substrate 2, the excellent emission characteristics are obtained similarly to those in the first embodiment.

Third Embodiment

Figure 3:
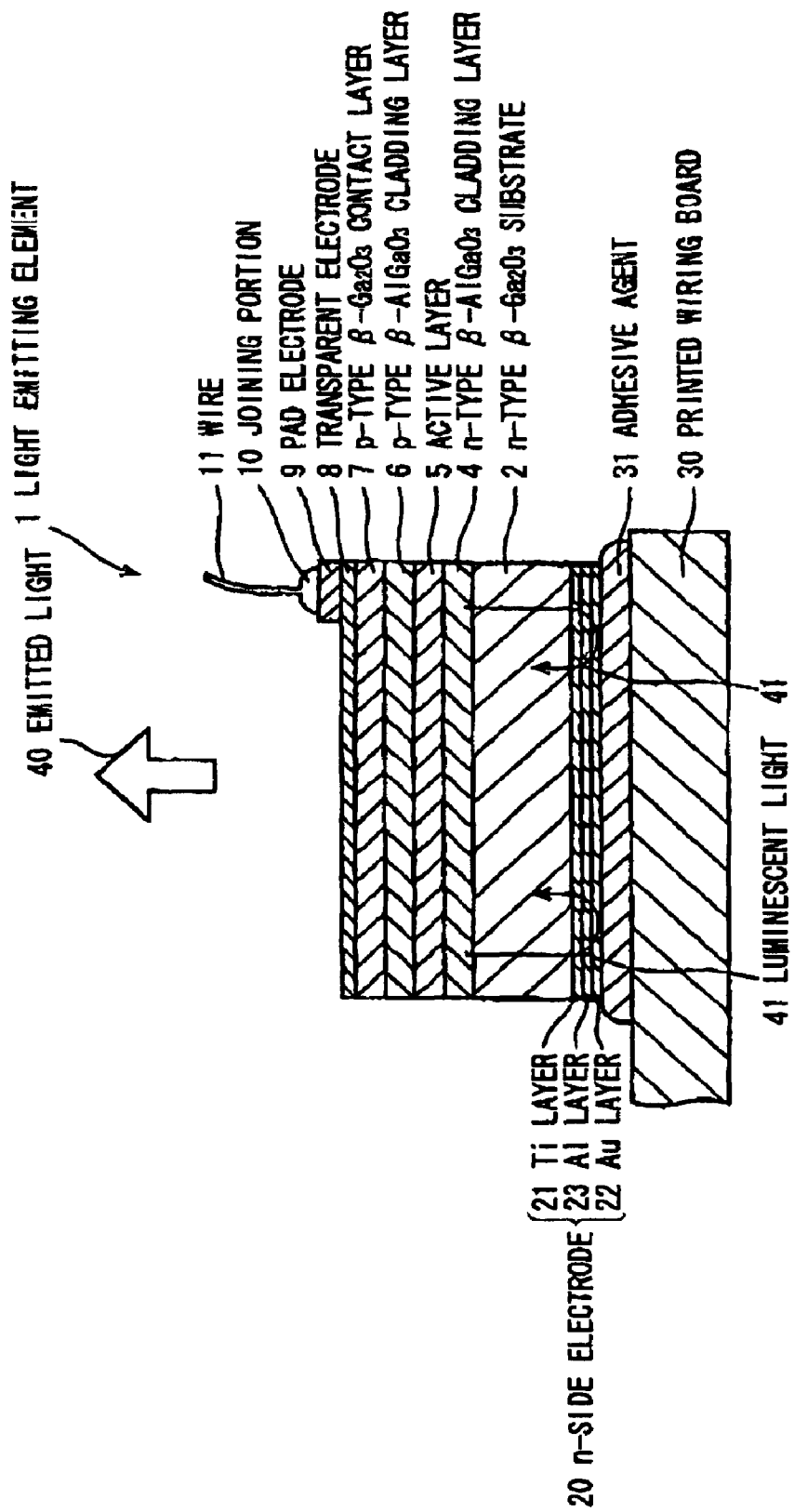
FIG. 3 is a cross sectional view showing a light emitting element according to a third embodiment of the present invention.

FIG. 3 shows a main portion of a light emitting element according to a third embodiment of the present invention. This light emitting element 1 is different only in the n-side electrode 20 from the light emitting element 1 according to the first embodiment. In the n-side electrode 20 of the light emitting element 1, the Ti layer 21, an Al layer 23 and the Au layer 22 are deposited in order on the lower surface of the n-type β-Ga$_2$O$_3$ substrate 2.

According to the third embodiment, the n-side electrode 20 has the desirable ohmic characteristics with the n-type β-Ga$_2$O$_3$ substrate 2. For this reason, the excellent emission characteristics are obtained similarly to those in the first embodiment.

Fourth Embodiment

Figure 4:
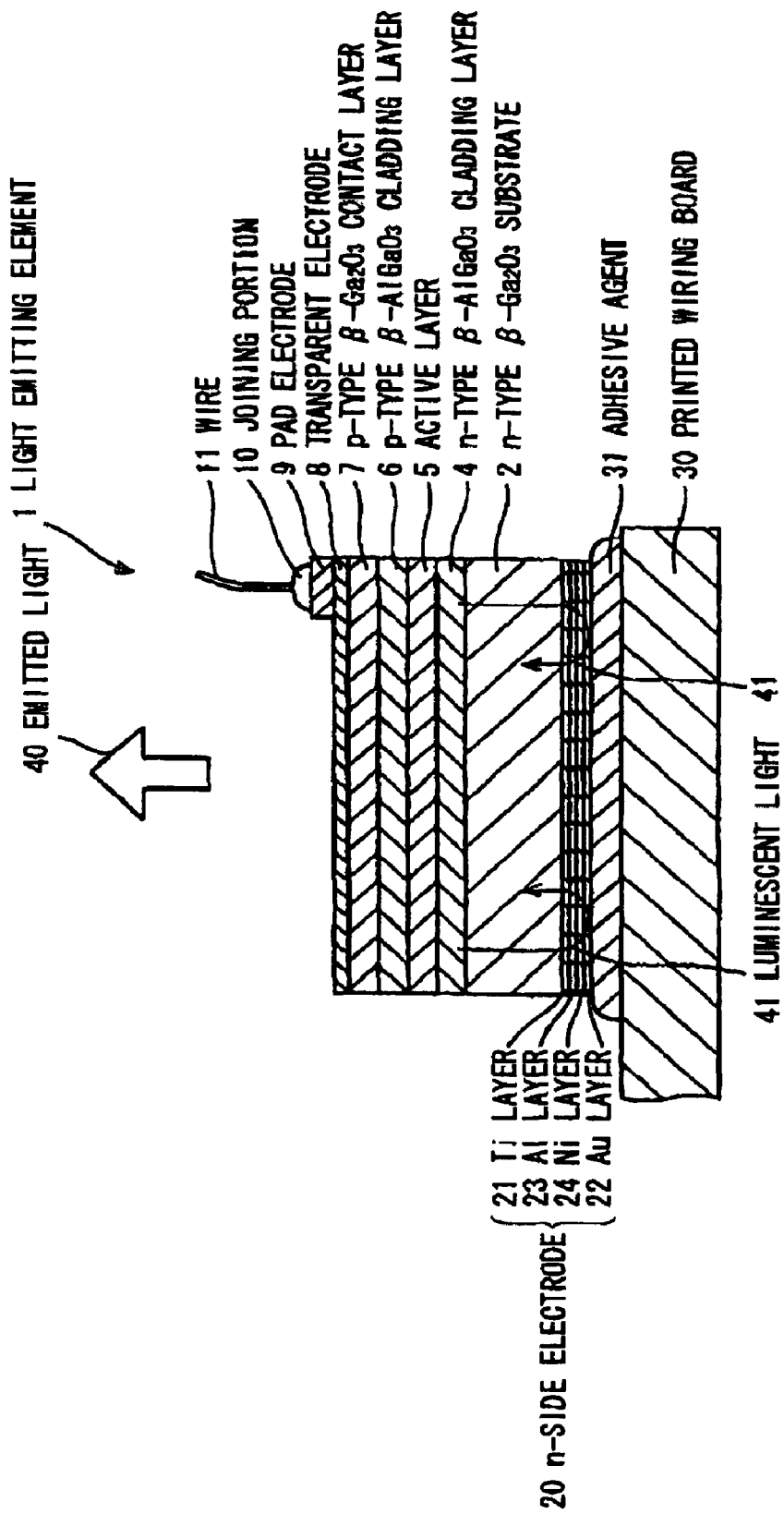
FIG. 4 is a cross sectional view showing a light emitting element according to a fourth embodiment of the present invention.

FIG. 4 shows a main portion of a light emitting element according to a fourth embodiment of the present invention. This light emitting element 1 is different only in the n-side electrode 20 from the light emitting element 1 according to the first embodiment. In the n-side electrode 20 of the light emitting element 1, the Ti layer 21, the Al layer 23, a Ni layer 24 and the Au layer 22 are deposited in order on the lower surface of the n-type β-Ga$_2$O$_3$ substrate 2.

According to the fourth embodiment, the n-side electrode 20 has the desirable ohmic characteristics with the n-type β-Ga$_2$O$_3$ substrate 2. For this reason, the excellent emission characteristics are obtained similarly to those in the first embodiment.

Examples of the present invention will be described hereinafter.

EXAMPLE 1

Figure 5:
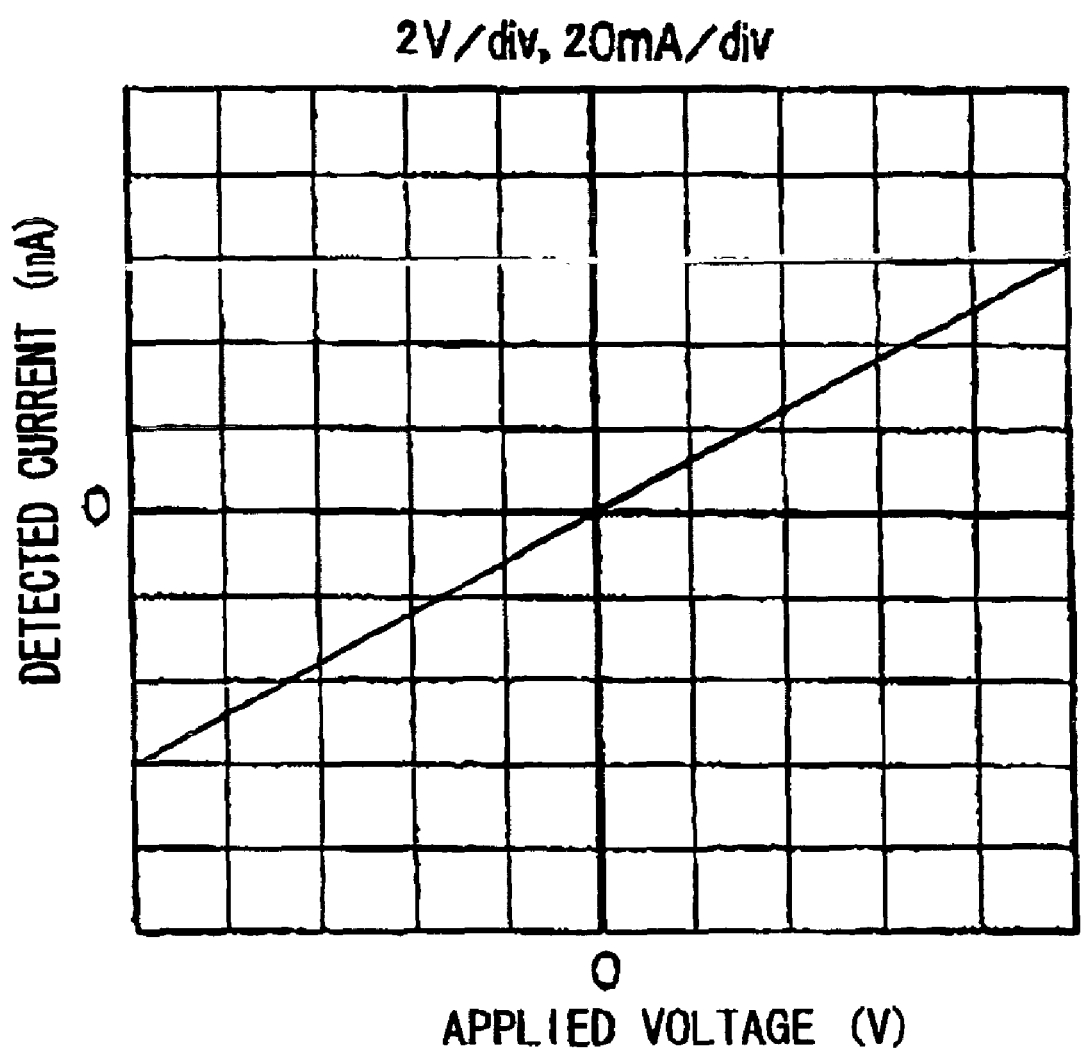
FIG. 5 is a current vs. voltage characteristic diagram of Example 1.

FIG. 5 is a current vs. voltage characteristic diagram of Example 1 of the present invention.

Example 1 corresponds to the first embodiment of the present invention. An n-side electrode was formed of a Ti layer formed on a substrate, made of 99.99% Ga$_2$O$_3$, containing no dopant added thereto. Etching was performed before the Ti layer was formed on the substrate, thereby cleaning a surface of the substrate. The Ti layer had a thickness of 150 Å, and was formed by irradiating a laser beam to a Ti target for 7.5 minutes with an output of 100 mw by utilizing the PLD method. The current vs. voltage characteristics were measured at 25° C.

According to Example 1, since ohmic characteristics are obtained at 25° C., there are obtained the excellent emission characteristics that it is possible to prevent the degradation of the electrode due to generation or the like of the current loss, or the Joule heat in the electrode portion, and the deterioration of the characteristics of the compound semiconductor laser or the LED.

EXAMPLE 2

Figure 6:
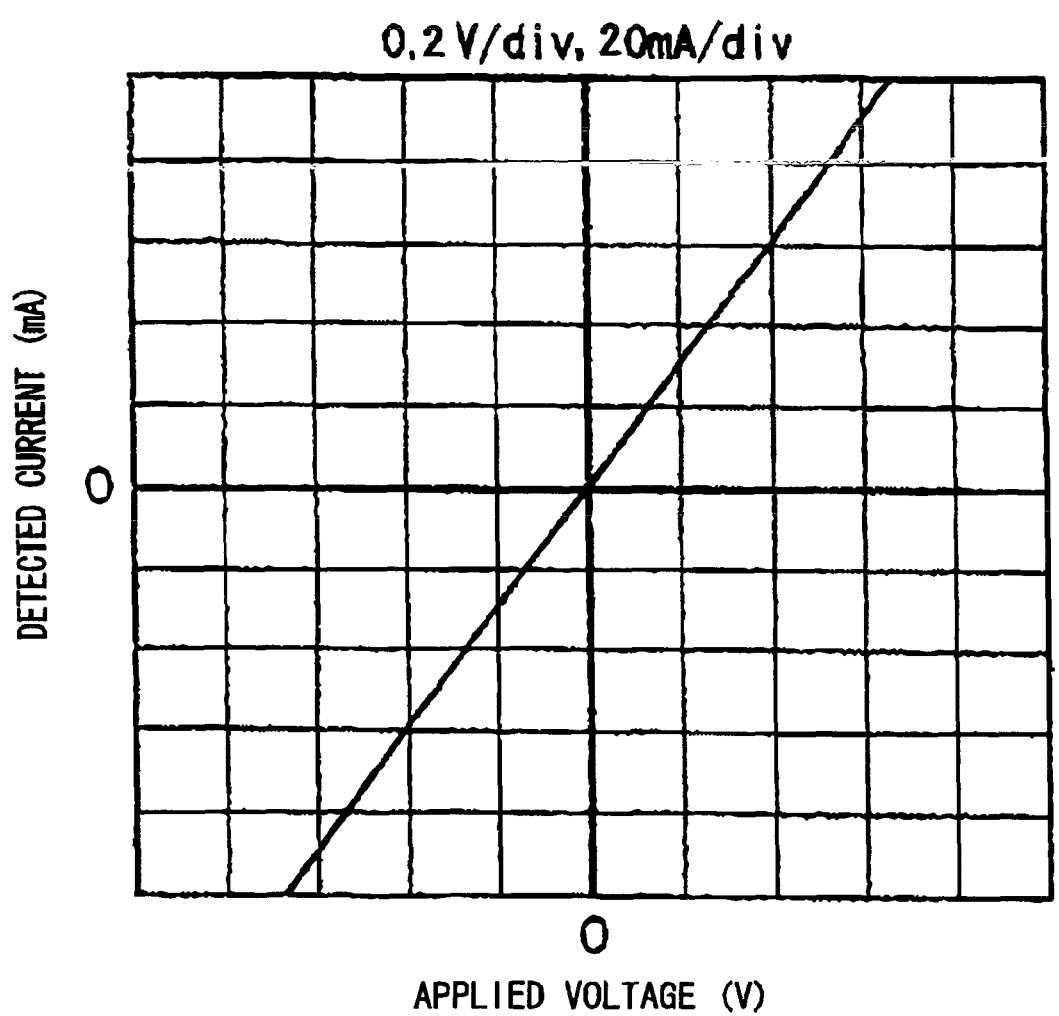
FIG. 6 is a current vs. voltage characteristic diagram at 25° C. in Example 2.
Figure 7:
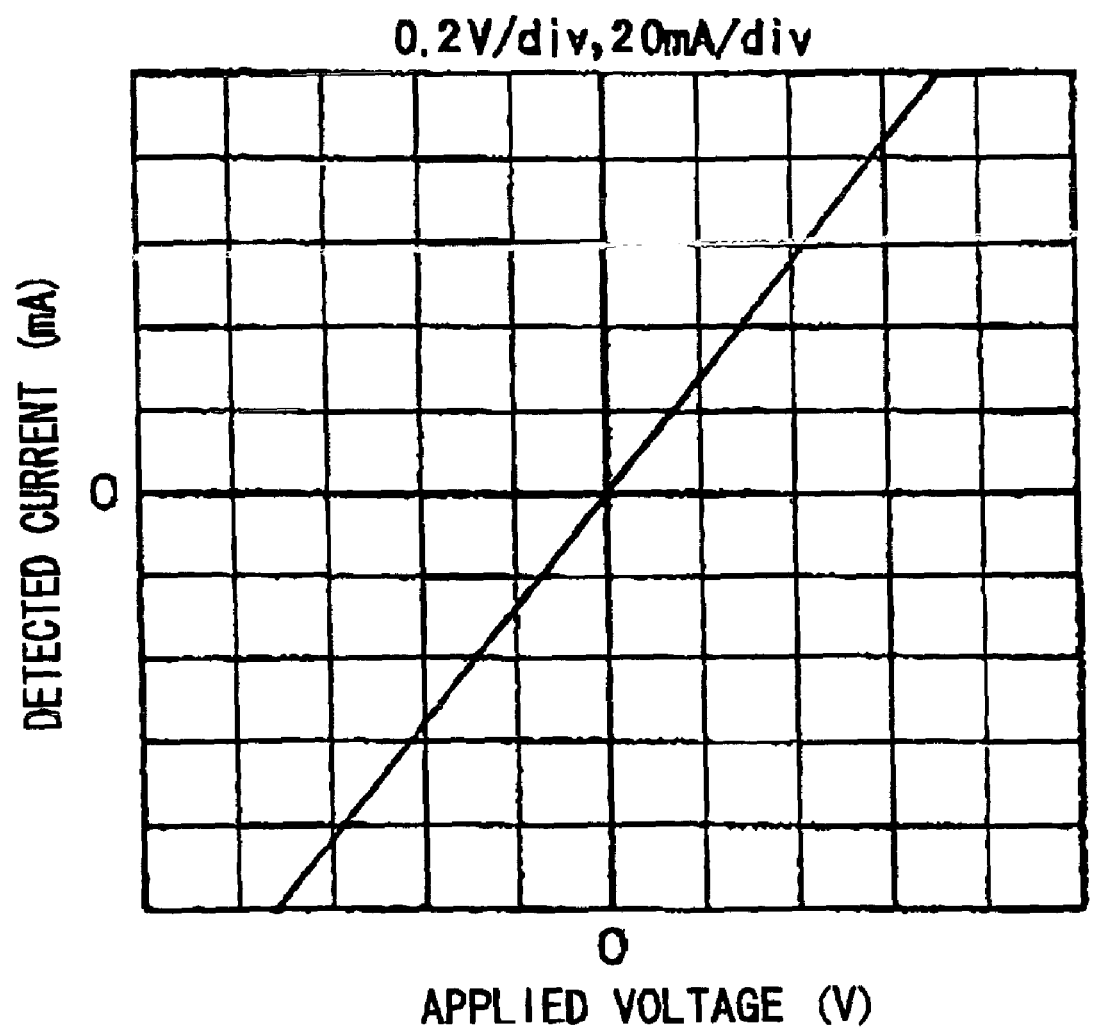
FIG. 7 is a current vs. voltage characteristic diagram after an n-side electrode is held at 300° C. for 5 minutes in Example 2.
Figure 8:
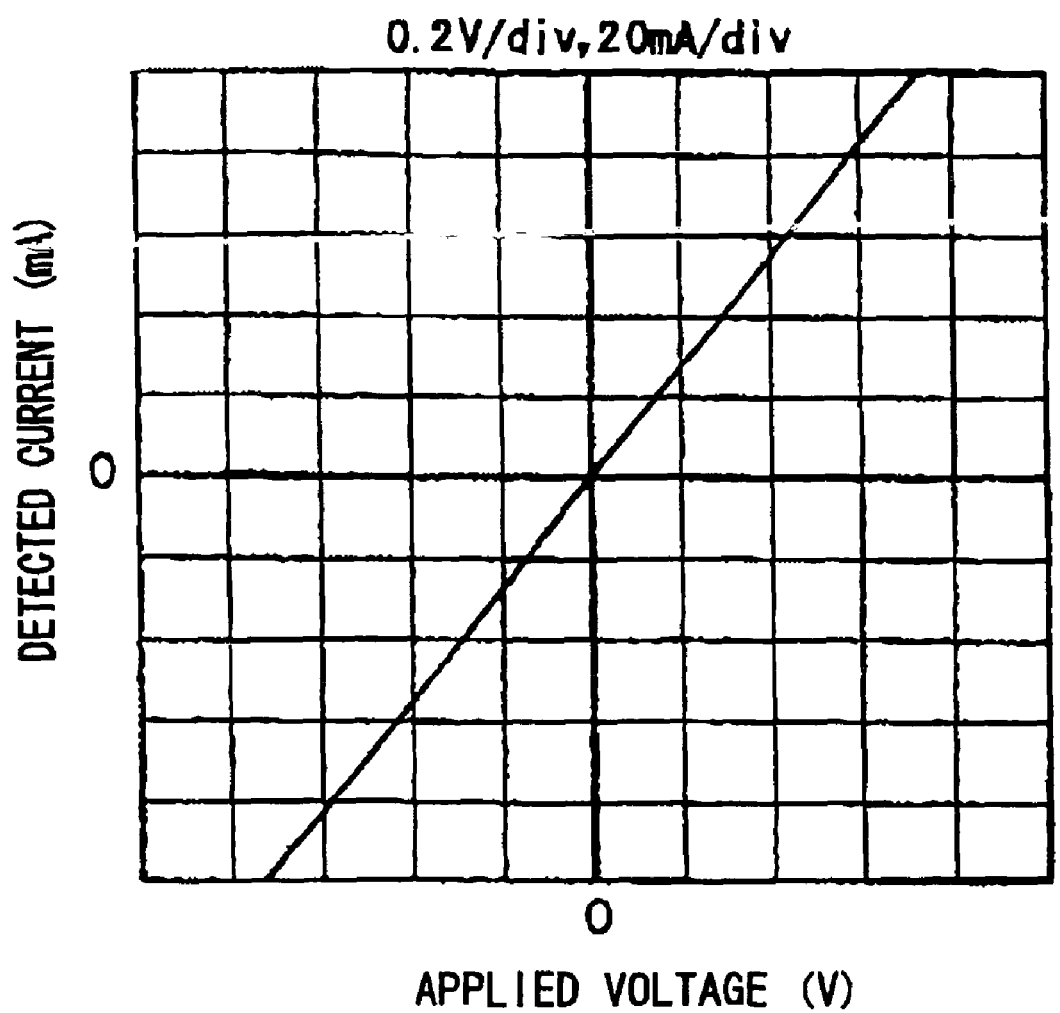
FIG. 8 is a current vs. voltage characteristic diagram after the n-side electrode is held at 600° C. for 5 minutes in Example 2.
Figure 9:
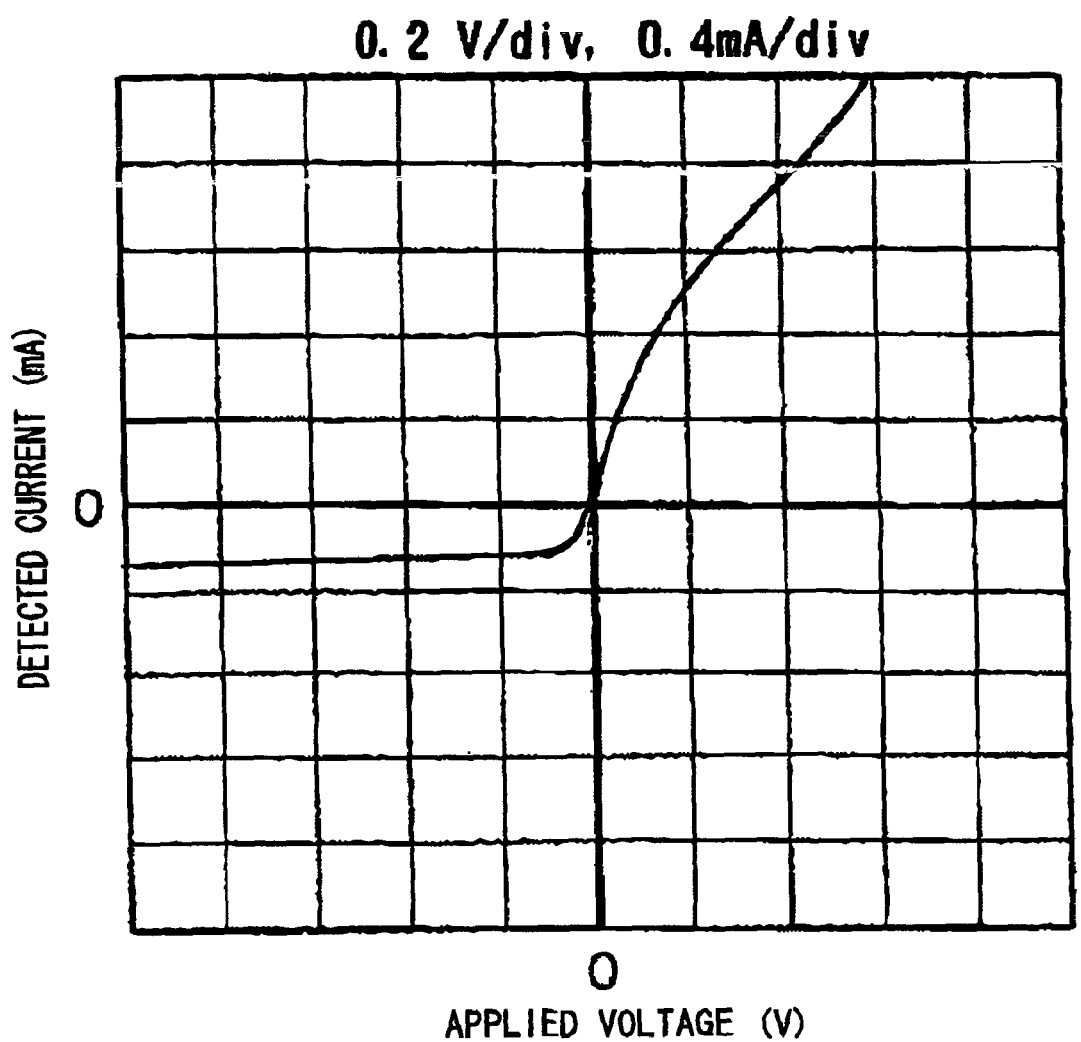
FIG. 9 is a current vs. voltage characteristic diagram after the n-side electrode is held at 700° C. for 5 minutes in Example 2.

FIG. 6 is a current vs. voltage characteristic diagram at 25° C. in Example 2 of the present invention, FIG. 7 is a current vs. voltage characteristic diagram after an n-side electrode is held at 300° C. for 5 minutes in Example 2, FIG. 8 is a current vs. voltage characteristic diagram after the n-side electrode is held at 600° C. for 5 minutes in Example 2, and FIG. 9 is a current vs. voltage characteristic diagram after the n-side electrode is held at 700° C. for 5 minutes in Example 2.

Example 2 corresponds to the second embodiment. The n-side electrode was formed by depositing a Ti layer and an Au layer on the substrate, made of 99.99% Ga$_2$O$_3$, containing no dopant added thereto. The etching was performed similarly to Example 1, thereby cleaning the surface of the substrate. The Ti layer had a thickness of 150 Å, and the Au layer had a thickness of 500 Å. The Ti layer and the Au layer were formed by irradiating a laser beam to a Ti target for 7.5 minutes and an Au target for 25 minutes with an output of 100 mW by utilizing the PLD method, respectively. The current vs. voltage characteristics after the n-side electrode was held while N$_2$ was caused to flow at 200 ml/min were measured.

According to Example 2, the current vs. voltage characteristics after the n-side electrode was held at 25° C. to 600° C. showed the ohmic characteristics. However, the current vs. voltage characteristics after the n-side electrode was held at 700° C. for 5 minutes showed the Schottky characteristics.

In addition, according to Example 2, the current vs. voltage characteristics show the ohmic characteristics by only forming the Ti layer and Au layer. In addition, since the n-side electrode shows the ohmic characteristics in the range of 25 to at least 600° C., it can be used in a wide use condition from a room temperature to a temperature at which the heat-resistance property is required.

EXAMPLE 3

Figure 10:
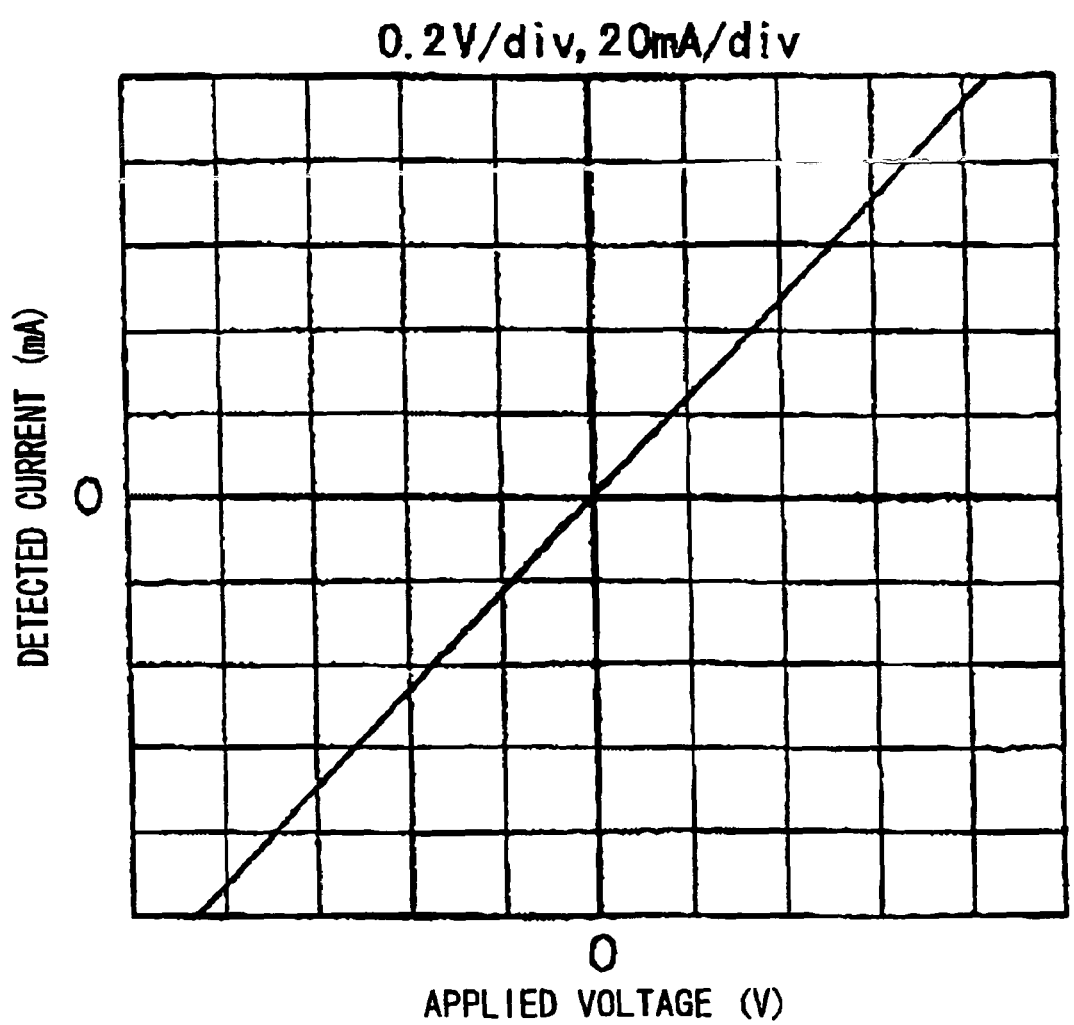
FIG. 10 is a current vs. voltage characteristic diagram at 25° C. in Example 3.
Figure 11:
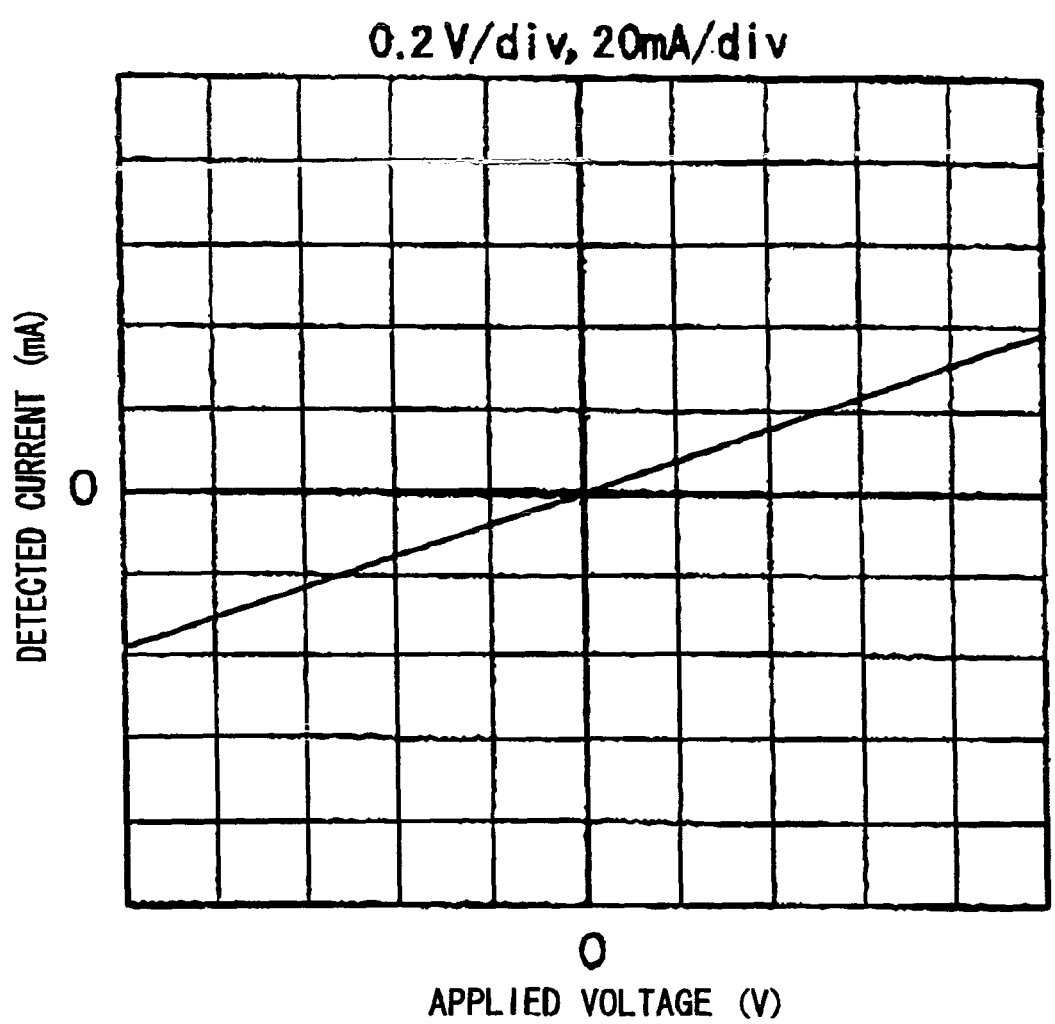
FIG. 11 is a current vs. voltage characteristic diagram after an n-side electrode is held at 800° C. for 5 minutes in Example 3.

FIG. 10 is a current vs. voltage characteristic diagram at 25° C. in Example 3, and FIG. 11 is a current vs. voltage characteristic diagram after an n-side electrode is held at 800° C. for 5 minutes in Example 3.

Example 3 corresponds to the second embodiment. The n-side electrode was formed of a Ti layer and an Al layer formed on the substrate, made of 99.99% Ga$_2$O$_3$, containing no dopant added thereto. The etching was performed similarly to Example 1, thereby cleaning the surface of the substrate. The Ti layer had a thickness of 150 Å, and the Al layer had a thickness of 1000 Å. The Ti layer and the Au layer were formed by irradiating the laser beam to the Ti target for 7.5 minutes and an Al target for 50 minutes with an output of 100 mW by utilizing the PLD method, respectively. The current vs. voltage characteristics after the n-side electrode was held while N$_2$ was caused to flow at 200 ml/min were measured.

According to Example 3, the current vs. voltage characteristics after the n-side electrode is held at 25 to 700° C. show satisfactory ohmic characteristics. In addition, the current vs. voltage characteristics after the n-side electrode is held at 800° C. also show the ohmic characteristics although the current is caused to hardly flow.

In addition, according to Example 3, the current vs. voltage characteristics show the ohmic characteristics by only forming the Ti layer and the Al layer.

EXAMPLE 4

Figure 12:
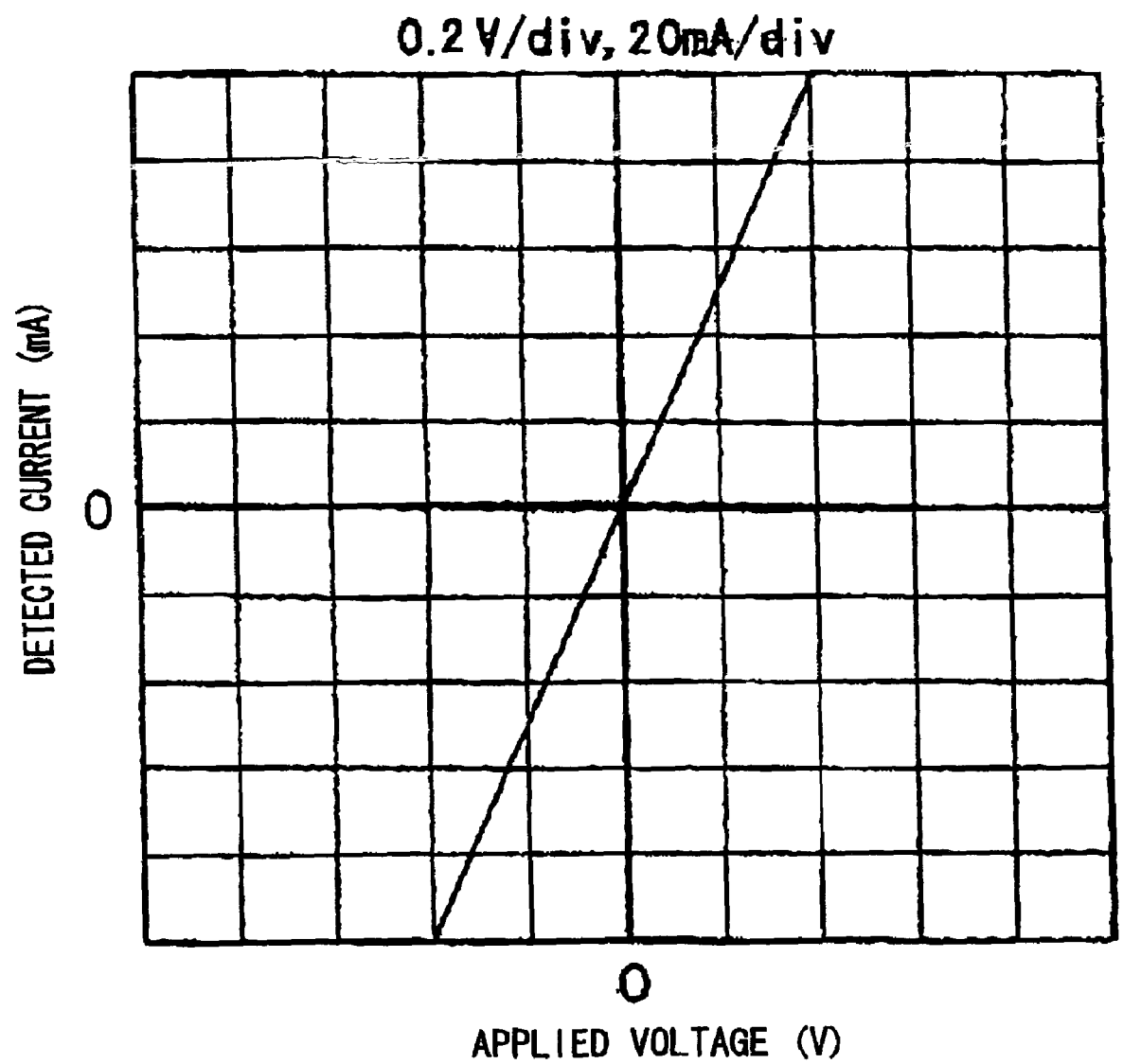
FIG. 12 is a current vs. voltage characteristic diagram at 25° C. in Example 4.
Figure 13:
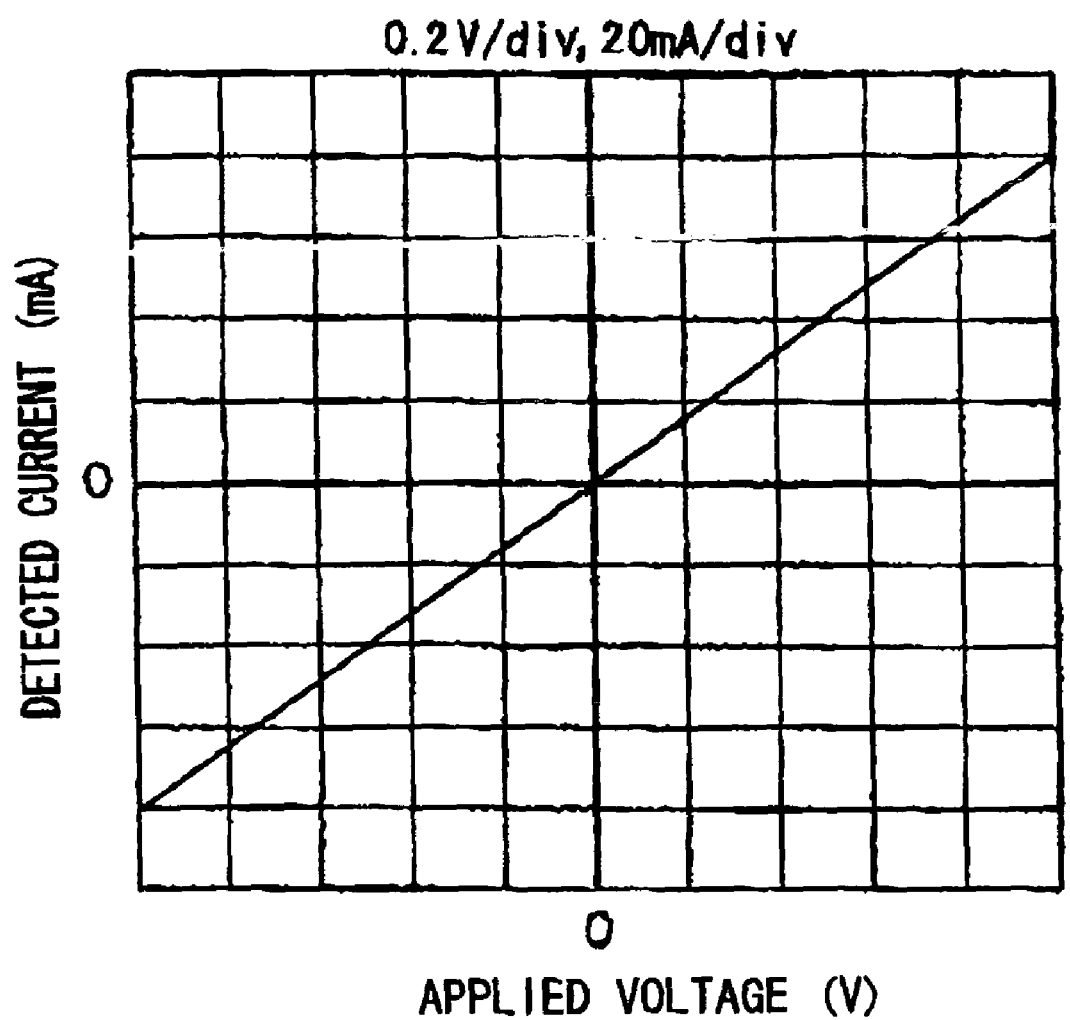
FIG. 13 is a current vs. voltage characteristic diagram after the n-side electrode is held at 700° C. for 5 minutes in Example 4.
Figure 14:
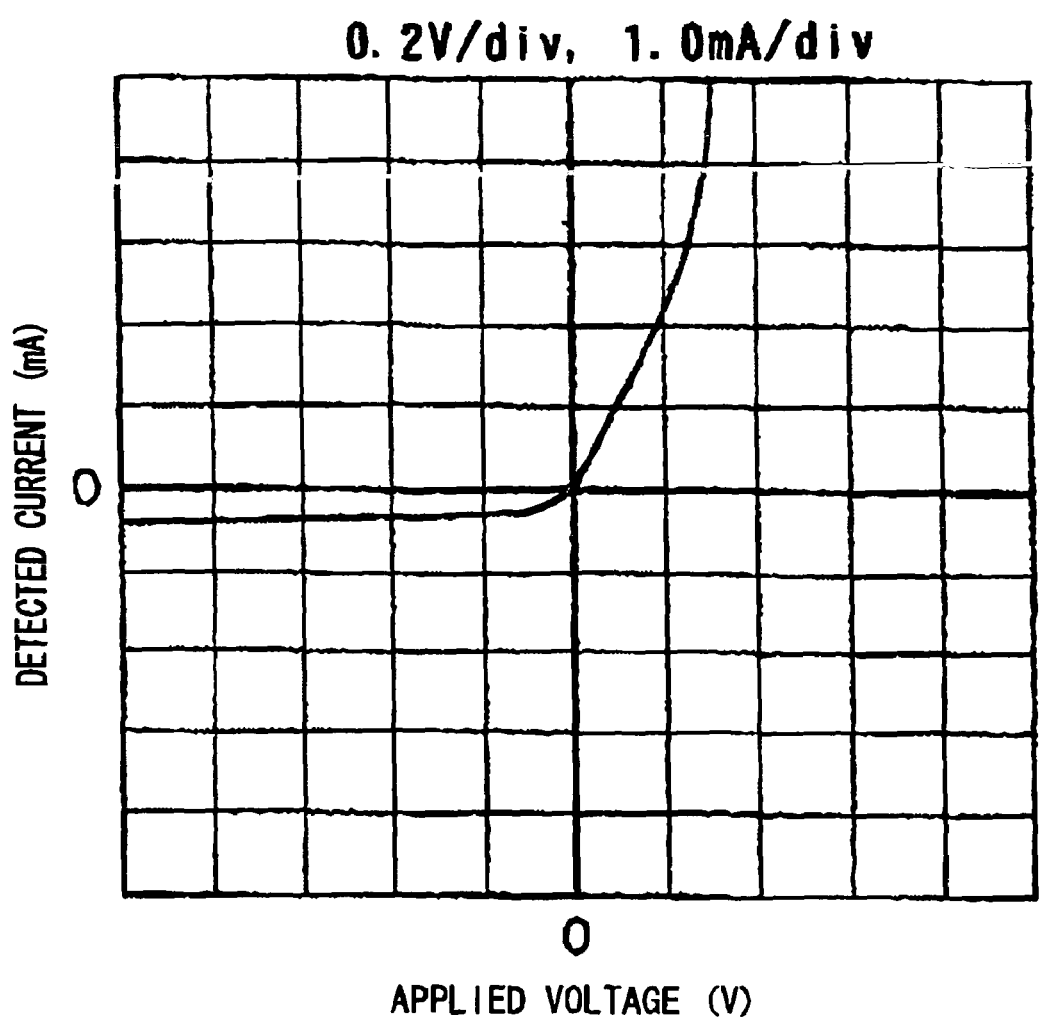
FIG. 14 is a current vs. voltage characteristic diagram after the n-side electrode is held at 800° C. for 5 minutes in Example 4.

FIG. 12 is a current vs. voltage characteristic diagram at 25° C. in Example 4 of the present invention, FIG. 13 is a current vs. voltage characteristic diagram after an n-side electrode is held at 700° C. for 5 minutes in Example 4, and FIG. 14 is a current vs. voltage characteristic diagram after the n-side electrode is held at 800° C. for 5 minutes in Example 4.

Example 4 corresponds to the third embodiment. The n-side electrode was formed of a Ti layer, an Al layer and an Au layer formed on the substrate, made of 99.99% Ga$_2$O$_3$, containing no dopant added thereto. The etching was performed similarly to Example 1, thereby cleaning the surface of the substrate. The Ti layer had a thickness of 150 Å, the Al layer had a thickness of 1000 Å, and the Au layer had a thickness of 500 Å. The Ti layer, the Al layer and the Au layer were formed by irradiating the laser beam to the Ti target for 7.5 minutes, the Al target for 50 minutes and the Au target for 25 minutes with the output of 100 mW, respectively. The current vs. voltage characteristics after the n-side electrode was held was performed while N$_2$ was caused to flow at 200 ml/min were measured.

According to Example 4, the current vs. voltage characteristics show the ohmic characteristics in the range of 25 to 700° C. However, the current vs. voltage characteristics after the n-side electrode is held at 800° C. or more show the Schottky characteristics. In addition, the n-side electrode shows the ohmic characteristics by only forming the Ti layer, the Al layer and the Au layer.

EXAMPLE 5

Figure 15:
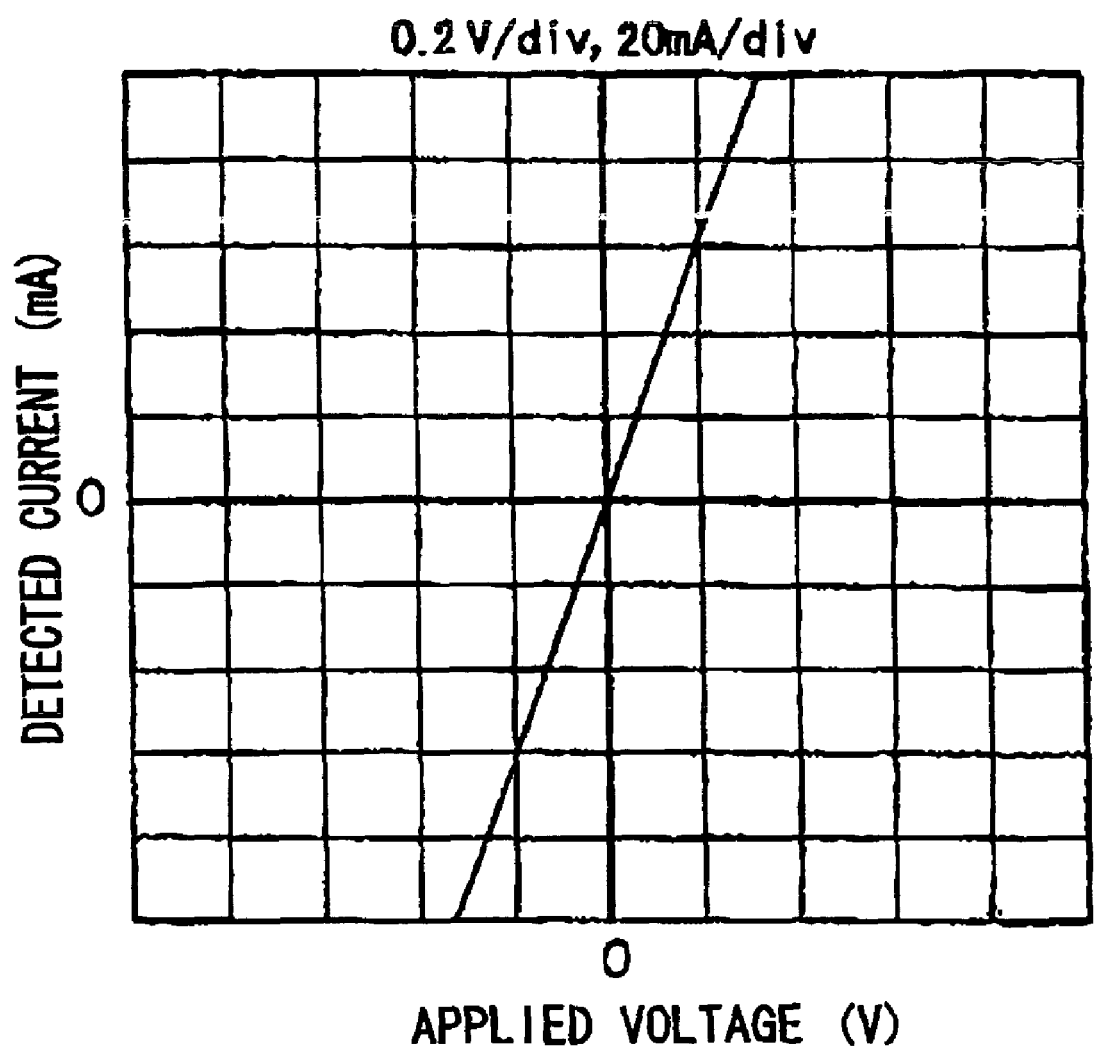
FIG. 15 is a current vs. voltage characteristic diagram at 25° C. in Example 5.
Figure 16:
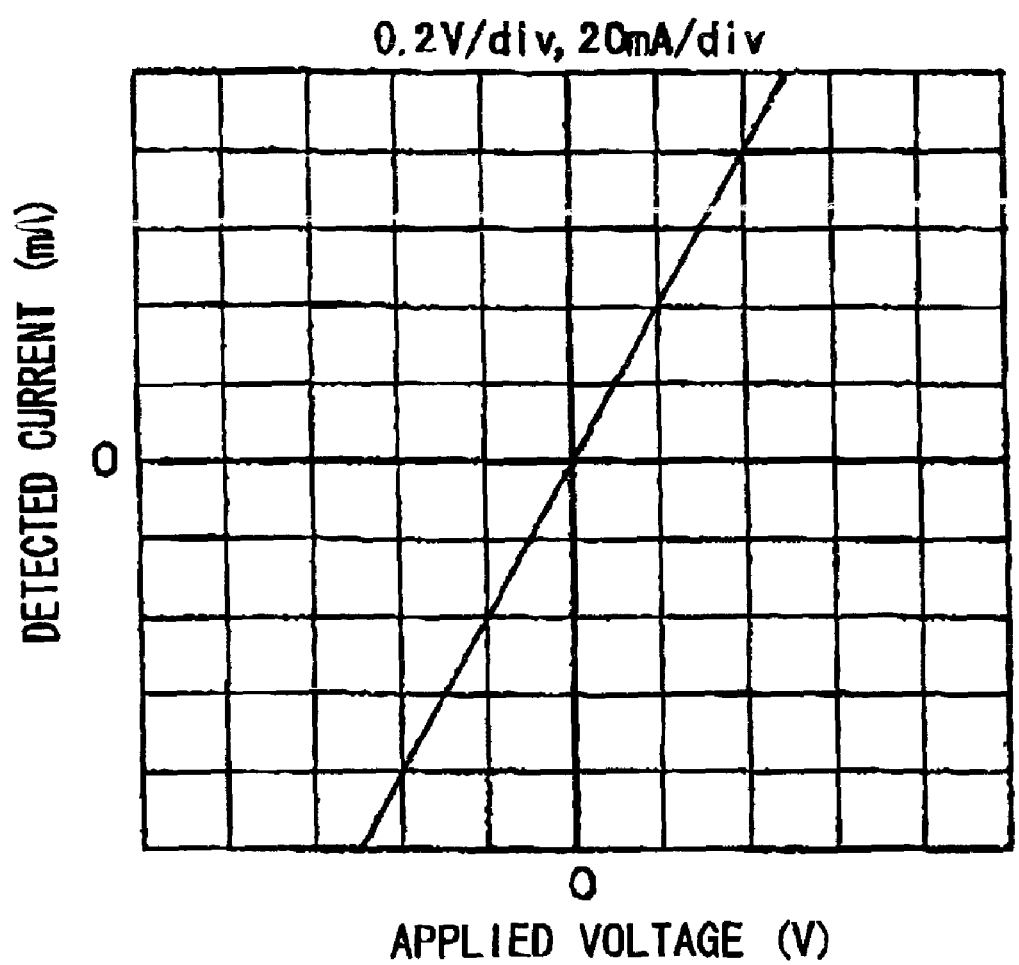
FIG. 16 is a current vs. voltage characteristic diagram after an n-side electrode is held at 400° C. for 5 minutes in Example 5.
Figure 17:
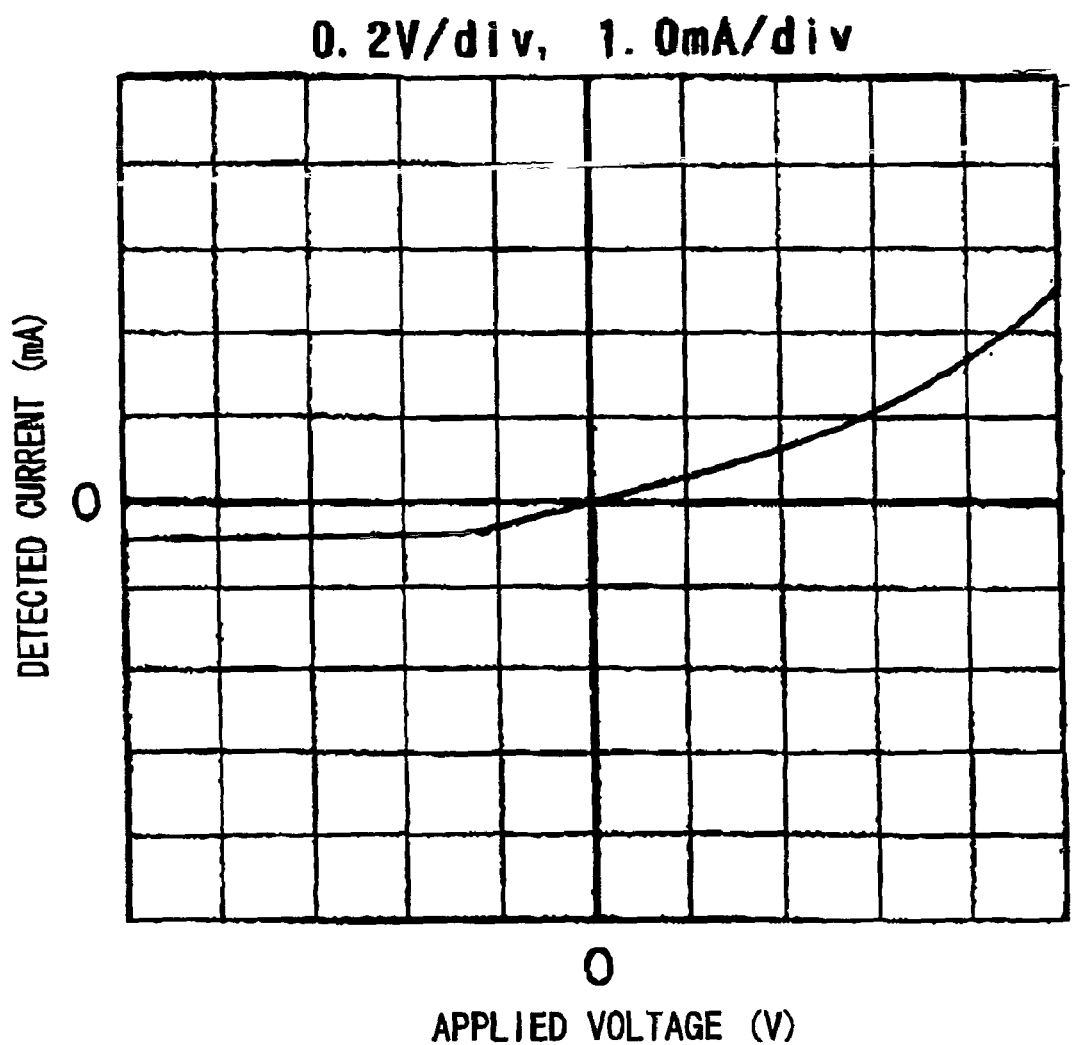
FIG. 17 is a current vs. voltage characteristic diagram after the n-side electrode is held at 800° C. for 5 minutes in Example 5.

FIG. 15 is a current vs. voltage characteristic diagram at 25° C. in Example 5 of the present invention, FIG. 16 is a current vs. voltage characteristic diagram after an n-side electrode is held at 400° C. for 5 minutes in Example 5, and FIG. 17 is a current vs. voltage characteristic diagram after the n-side electrode is held at 800° C. for 5 minutes in Example 5.

Example 5 corresponds to the fourth embodiment. The n-side electrode was formed of the Ti layer, the Al layer, a Ni layer and the Au layer formed on the substrate, made of 99.99% $Ga_2O_3$, containing no dopant added thereto. The etching was performed similarly to Example 1, thereby cleaning the surface of the substrate. The Ti layer had a thickness of 150 Å, the Al layer had a thickness of 1000 Å, the Ni layer had a thickness of 400 Å, and the Au layer had a thickness of 500 Å. The Ti layer, the Al layer, the Ni layer and the Au layer were formed by irradiating the laser beam to the Ti target for 7.5 minutes, the Al target for 50 minutes, the Ni target for 40 minutes, and the Au target for 25 minutes with the output of 100 mW by utilizing the PLd method, respectively. The current vs. voltage characteristics after the n-side electrode was held was performed while $N_2$ was caused to flow at 200 ml/min were measured.

According to Example 5, the current vs. voltage characteristics after the n-side electrode is held at 25° C. and 400° C. show the ohmic characteristics. However, the current vs. voltage characteristics after the n-side electrode is held at 800° C. show the Schottky characteristics. In addition, the n-side electrode shows the ohmic characteristics by only forming the Ti layer, the Ni layer, and the Au layer. Also, when the heat treatment is performed, since the n-side electrode shows the ohmic characteristics in the range of 25 to at least 400° C., it can be used in the wide use condition from the room temperature to the temperature at which the heat resistance property is required.

Comparative Example 1

Figure 18:
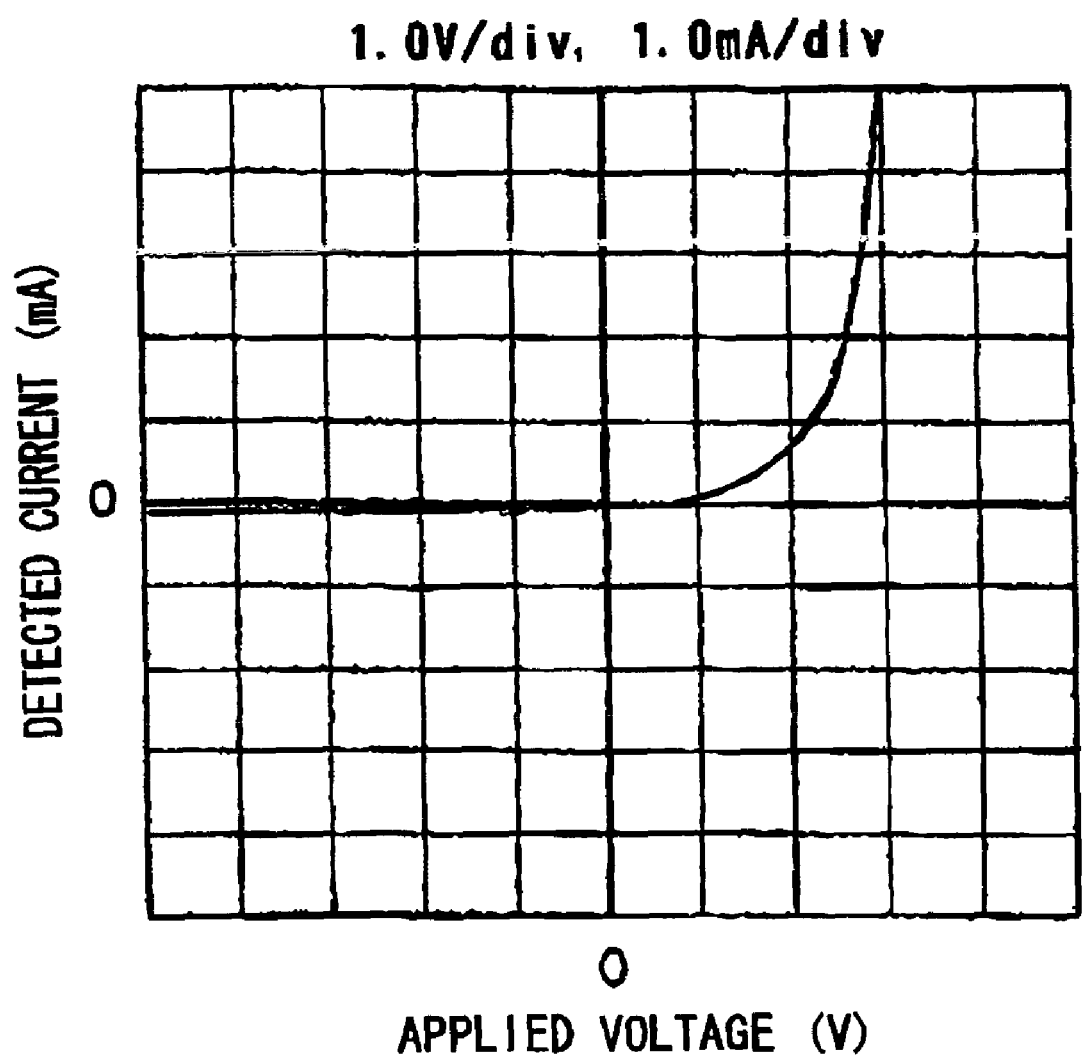
FIG. 18 is a current vs. voltage characteristic diagram at 25° C. in Comparative Example 1.
Figure 19:
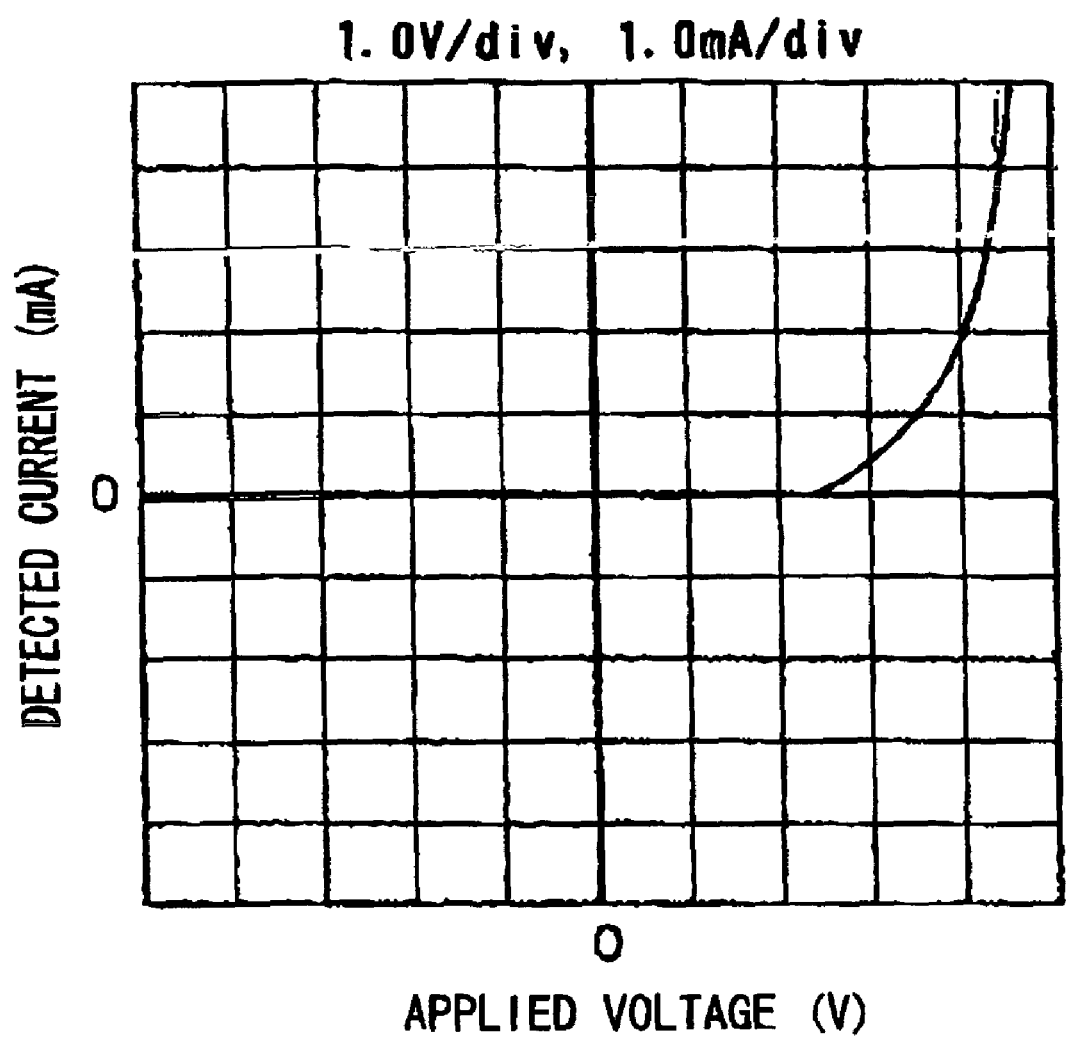
FIG. 19 is a current vs. voltage characteristic diagram after the n-side electrode is held at 100° C. for 10 minutes in Comparative Example 1.
Figure 20:
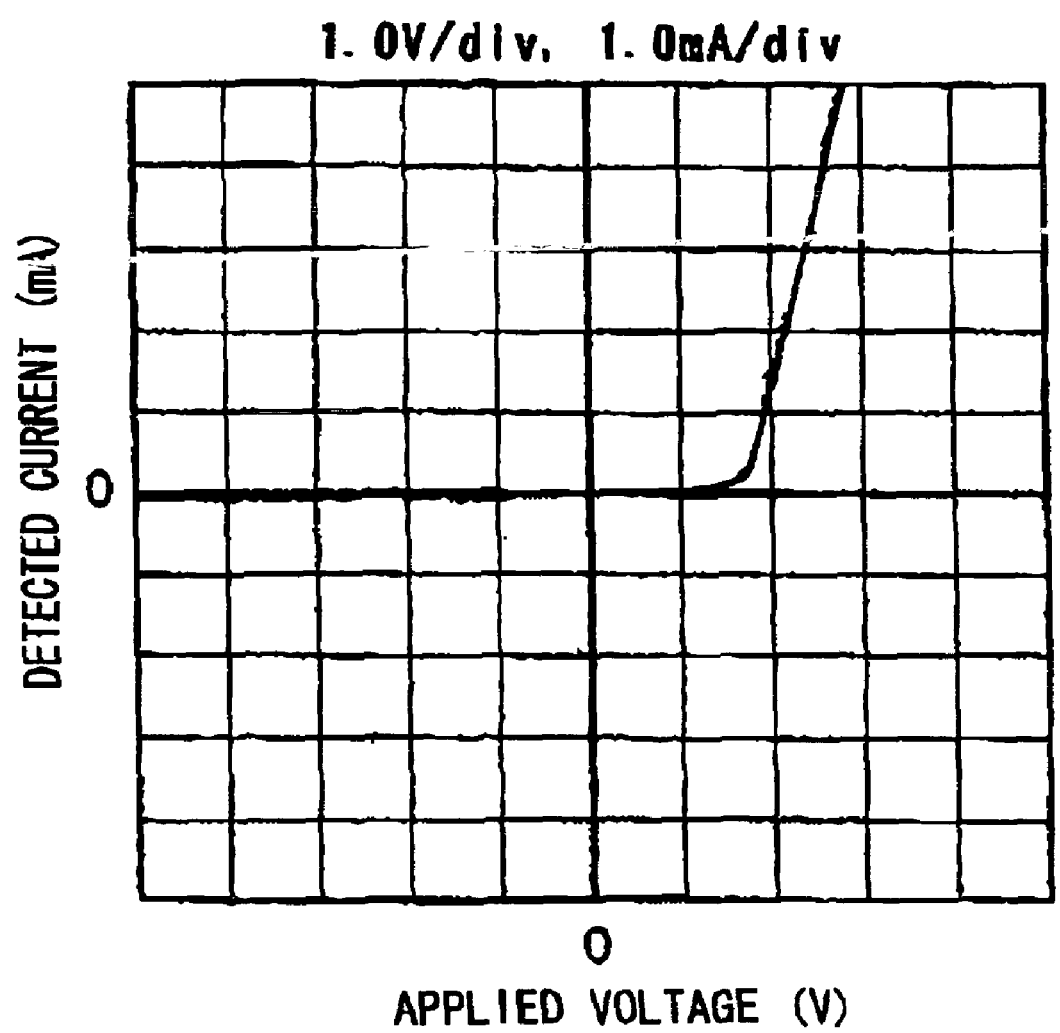
FIG. 20 is a current vs. voltage characteristic diagram after the n-side electrode is held at 200° C. for 10 minutes in Comparative Example 1.

FIG. 18 is a current vs. voltage characteristic diagram at 25° C. in Comparative Example 1, FIG. 19 is a current vs. voltage characteristic diagram after an n-side electrode is held at 100° C. for 10 minutes in Comparative Example 1, and FIG. 20 is a current vs. voltage characteristic diagram after the n-side electrode is held at 200° C. for 10 minutes in Comparative Example 1.

Comparative Example 1 is such that the n-side electrode was formed of an Au layer instead of the Ti layer and was formed on the substrate, made of 99.99% $Ga_2O_3$, containing no dopant added thereto. Before the Au layer was formed on the substrate, the etching was performed to clean the surface of the substrate. The Au layer was formed by irradiating a laser beam to an Au target for 25 minutes with an output of 100 mW by utilizing the PLD method. The current vs. voltage characteristics after a heat treatment was performed while Ar was caused to flow at 200 ml/min in 5% $H_2$ ambient were measured.

According to Comparative Example 1, when the Au layer is provided instead of the Ti layer on the $Ga_2O_3$ substrate, the Schottky characteristics are shown, and no ohmic characteristics are shown.

Comparative Example 2

Figure 21:
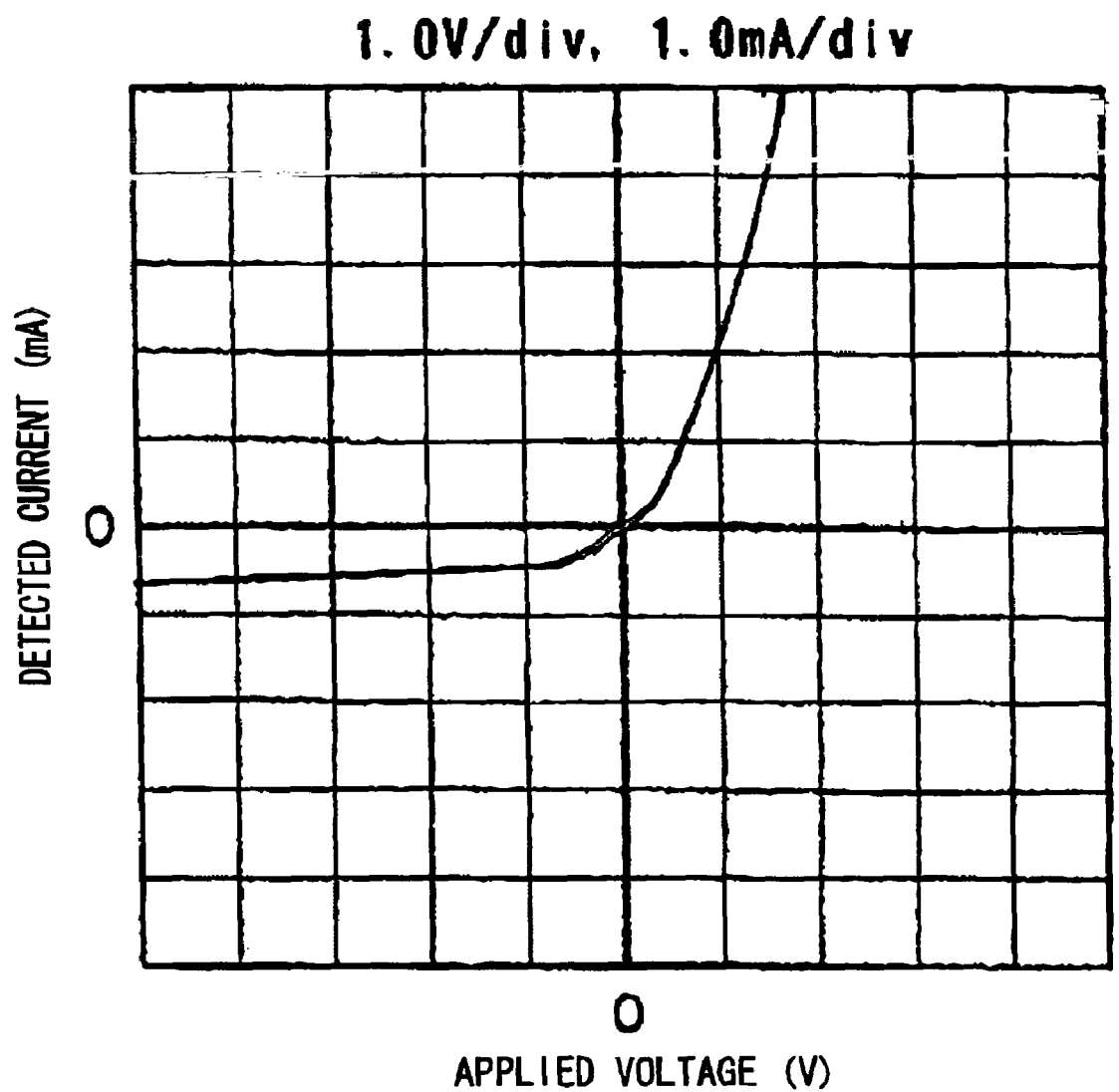
FIG. 21 is a current vs. voltage characteristic diagram at 25° C. in Comparative Example 2.
Figure 22:
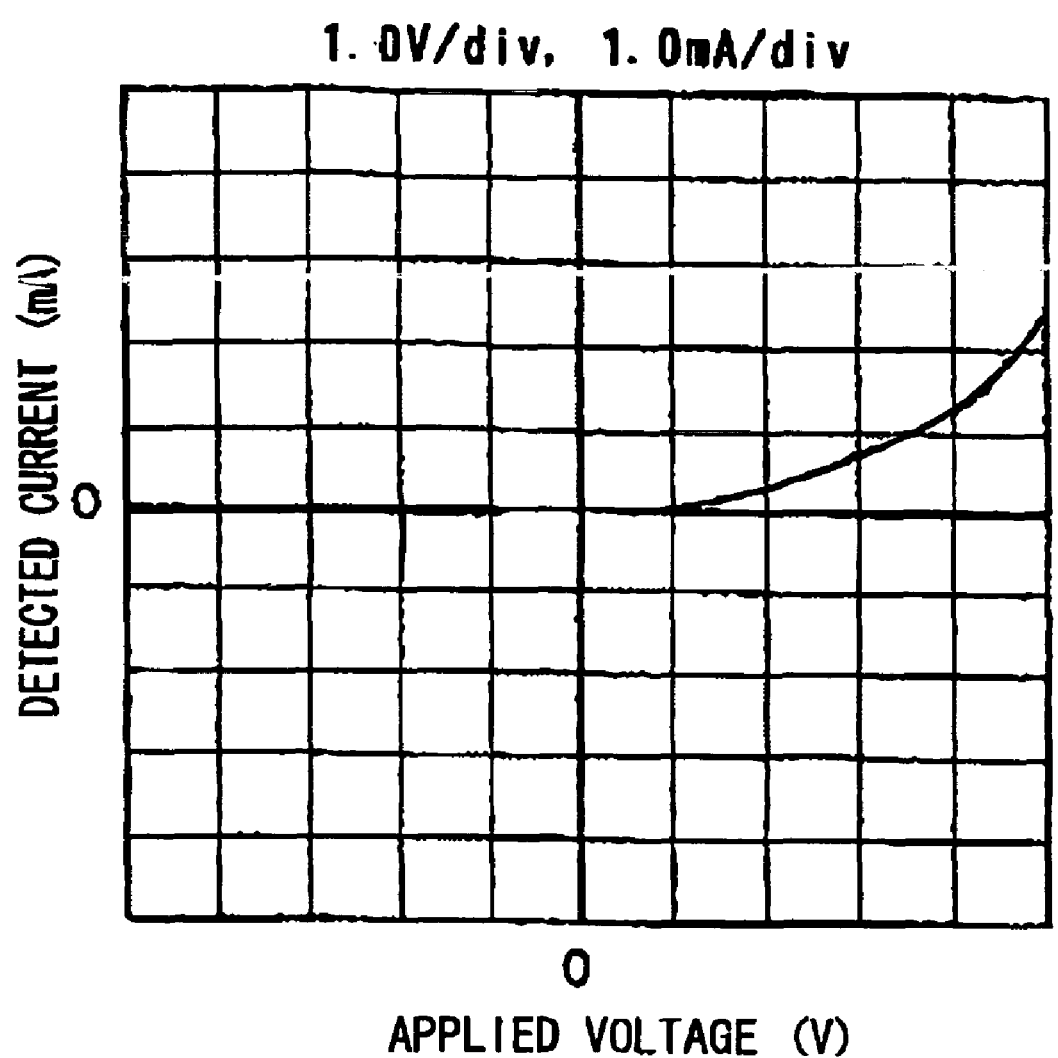
FIG. 22 is a current vs. voltage characteristic diagram after an n-side electrode is held at 100° C. for 10 minutes in Comparative Example 2.

FIG. 21 is a current vs. voltage characteristic diagram at 25° C. in Comparative Example 2, and FIG. 22 is a current vs. voltage characteristic diagram after the n-side electrode is held at 100° C. for 10 minutes in Comparative Example 2.

Comparative Example 2 is such that the n-side electrode was formed of a Pt layer instead of the Ti layer and was formed on the substrate, made of 99.99% $Ga_2O_3$, containing no dopant added thereto. The etching was performed similarly to Comparative Example 1, thereby cleaning the surface of the substrate. The Pt layer was formed by irradiating the laser beam to a Pt target with the output of 100 mW by utilizing the PLD method. The current vs. voltage characteristics after the heat treatment was performed while Ar was caused to flow at 200 ml/min in the 5% $H_2$ ambient were measured.

According to Comparative Example 2, when the Pt layer is provided instead of the Ti layer on the $Ga_2O_3$ substrate, the Schottky characteristics are shown, and no ohmic characteristics are shown.

Comparative Example 3

Figure 23:
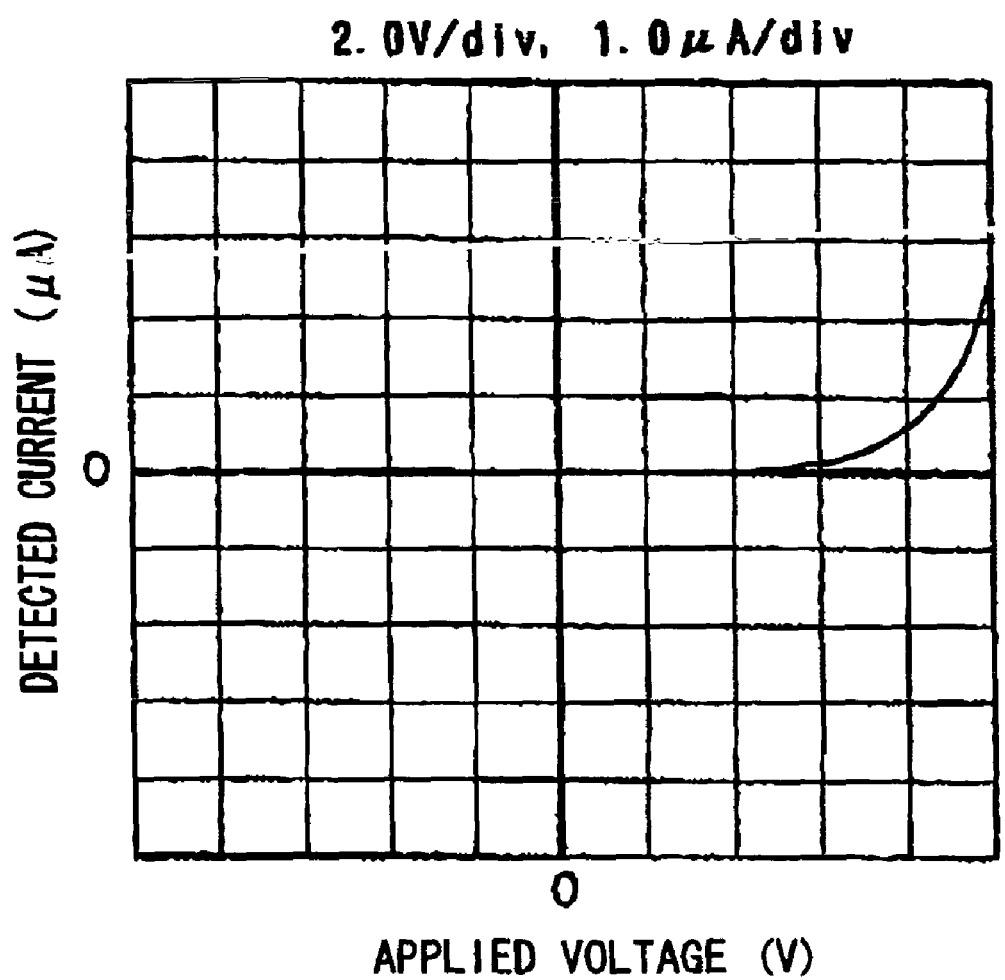
FIG. 23 is a current vs. voltage characteristic diagram at 25° C. in Comparative Example 3.
Figure 24:
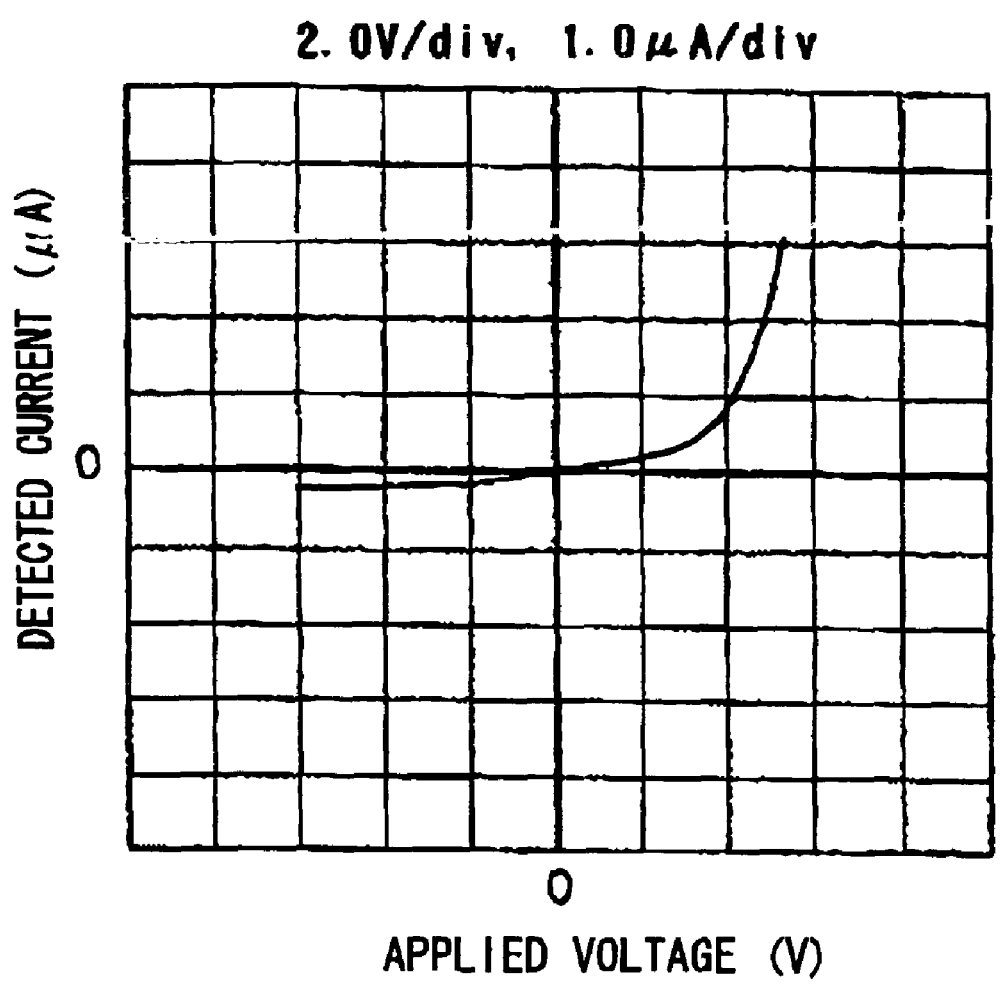
FIG. 24 is a current vs. voltage characteristic diagram after the n-side electrode is held at 100° C. for 30 minutes in Comparative Example 3.
Figure 25:
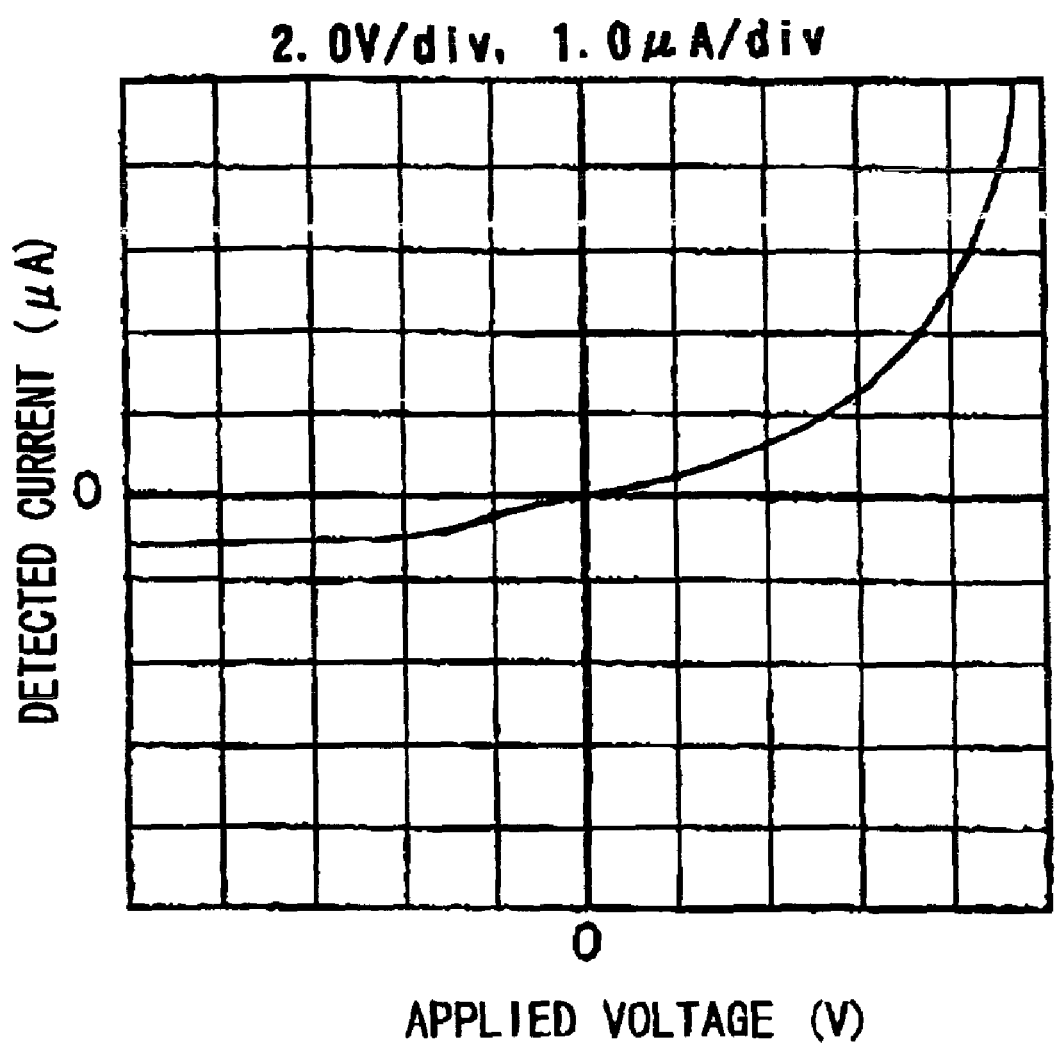
FIG. 25 is a current vs. voltage characteristic diagram after the n-side electrode is held at 100° C. for 5 minutes in Comparative Example 3.
Figure 26:
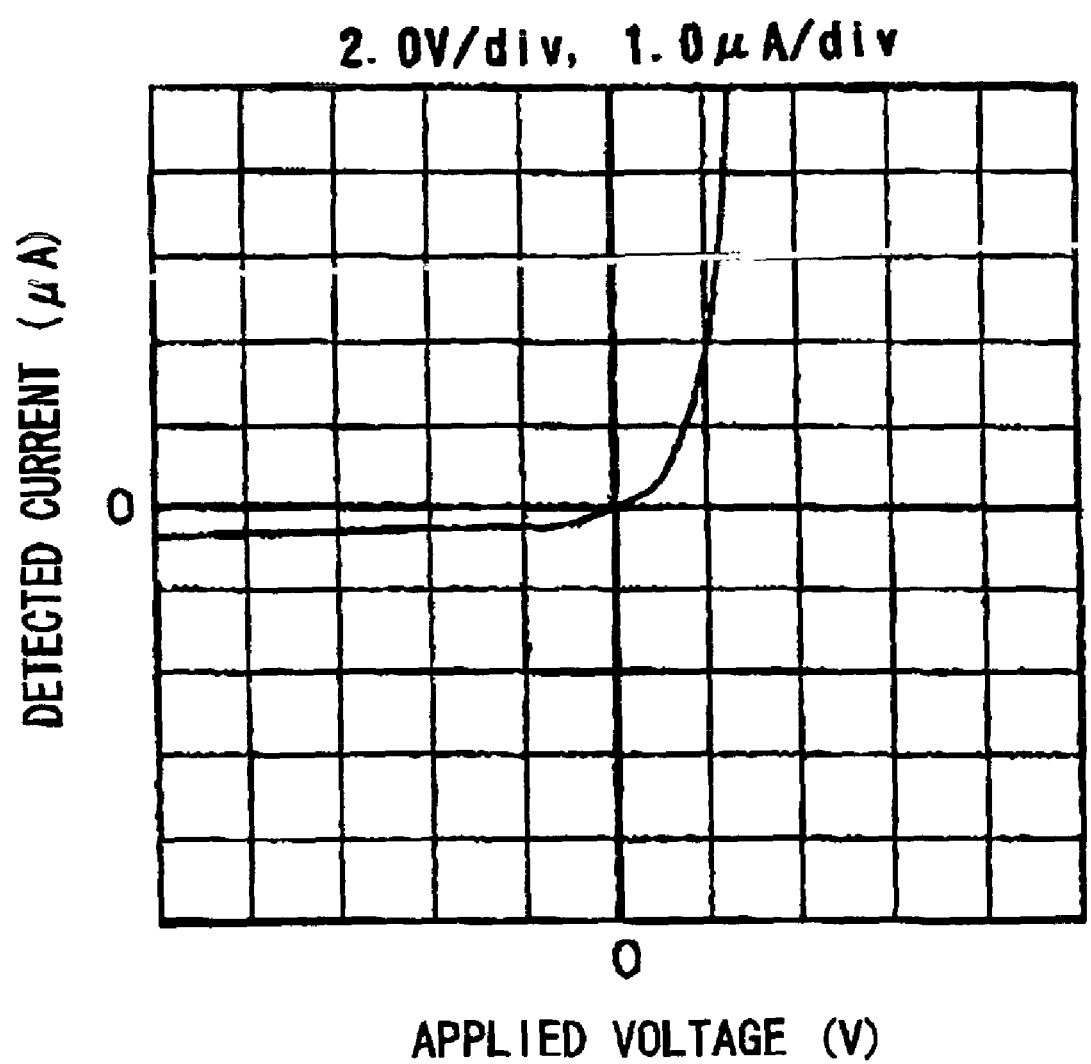
FIG. 26 is a current vs. voltage characteristic diagram after the n-side electrode is held at 200° C. for 30 minutes in Comparative Example 3.
Figure 27:
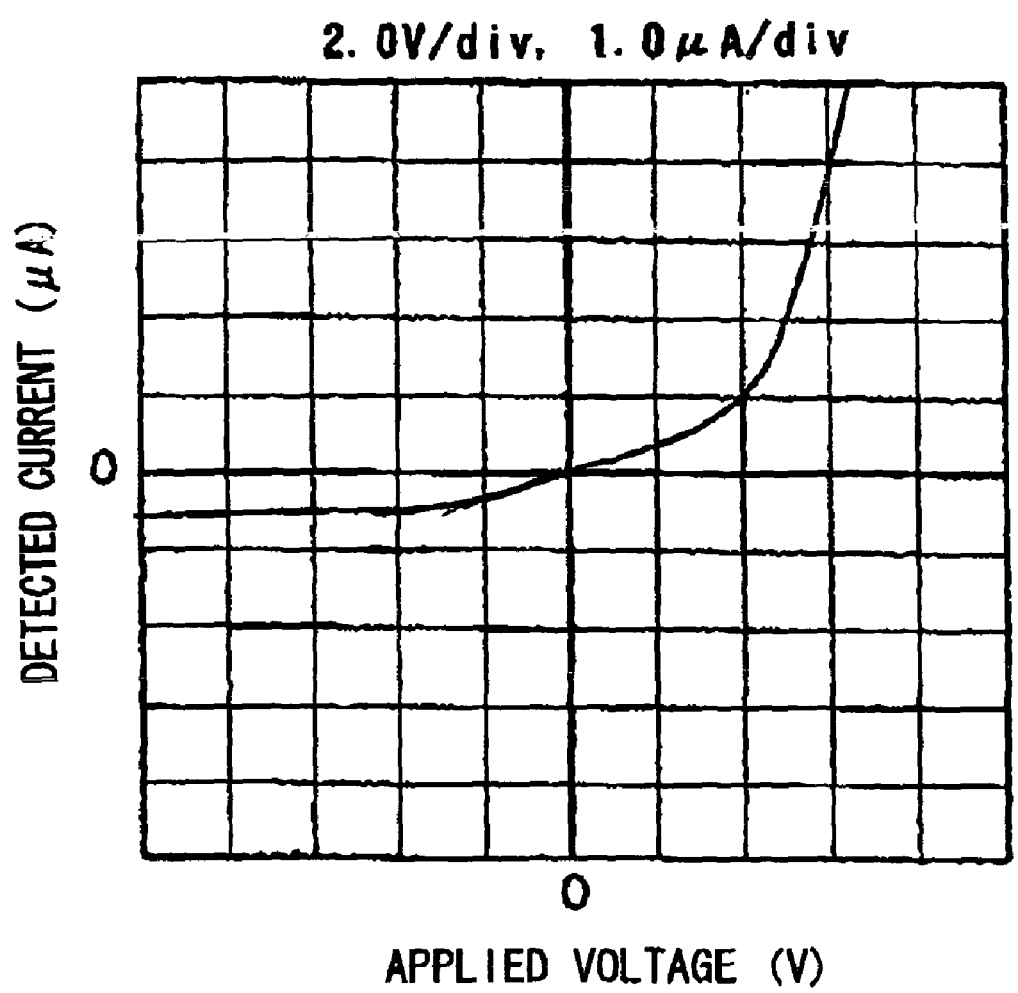
FIG. 27 is a current vs. voltage characteristic diagram after the n-side electrode is held at 200° C. for 5 minutes in Comparative Example 3.

FIG. 23 shows a current vs. voltage characteristic diagram at 25° C. in Comparative Example 3, FIG. 24 is a current vs. voltage characteristic diagram after an n-side electrode is held at 100° C. for 30 seconds in Comparative Example 3, FIG. 25 is a current vs. voltage characteristic diagram after the n-side electrode is held at 100° C. for 5 minutes in Comparative Example 3, FIG. 26 is a current vs. voltage characteristic diagram after the n-side electrode is held at 200° C. for 30 seconds in Comparative Example 3, and FIG. 27 is a current vs. voltage characteristic diagram after the n-side electrode is held at 200° C. for 5 minutes in Comparative Example 3.

Comparative Example 3 is such that the n-side electrode was formed by depositing a Ni layer and an Au layer instead of the Ti layer and the Au layer on the substrate, made of 99.99% $Ga_2O_3$, containing no dopant added thereto. The etching was performed similarly to Comparative Example 1, thereby cleaning the surface of the substrate. The Ni layer had a thickness of 400 Å and the Au layer had a thickness of 500 Å. Firstly, the Ni layer was formed by utilizing the PLD method. Next, the Au layer was formed by irradiating the laser beam to the Au target for 25 minutes with the output of 100 mW by utilizing the PLD method. The current vs. voltage characteristics after the n-side electrode was held was performed while $N_2$ was caused to flow at 200 ml/min were measured.

According to Comparative Example 3, when the Ni layer and the Au layer are provided instead of the Ti layer and the Au layer, the Schottky characteristics are shown, and no ohmic characteristics are shown.

It should be noted that the present invention is not limited to the above-mentioned embodiments and Examples described above, and the various changes thereof may be made without changing the gist of the invention. The metal film forming the electrode on the substrate may be formed by utilizing a vacuum evaporation method, a sputtering method, an ion plating method or the like in addition to the above-mentioned PLD method. In addition, an inactive gas such as helium, or a reducing gas such as hydrogen may be used as the ambient atmosphere gas instead of the argon and nitrogen described above. A pressure of the ambient atmosphere gas may fall within the range of $10^{-2}$ Torr to the atmospheric pressure. In addition, with regard to the $Ga_2O_3$ system compound semiconductor, the n-side electrode may be formed on the n-type contact layer formed on an insulating substrate. Also, although no heat treatment for obtaining the ohmic characteristics is performed in the present invention, the heat treatment may be performed when necessary. A oxide film preventing layer such as a Pt layer may be used instead of the Au layer 22. In addition, the present invention can be applied as the $Ga_2O_3$ system semiconductor element to a diode, a solar cell or the like in addition to the above-mentioned light emitting element.

INDUSTRIAL APPLICABILITY

According to the $Ga_2O_3$ system semiconductor element of the first invention, the $Ga_2O_3$ system semiconductor element can have the electrode in which the ohmic characteristics adapted to the $Ga_2O_3$ system compound semiconductor are obtained. In addition, according to the $Ga_2O_3$ system semiconductor element of the second invention, the heat treatment for obtaining the ohmic characteristics can be made unnecessary. These inventions are utilized in a light emitting device such as an LED or an LD.

The invention claimed is:

1. A $Ga_2O_3$ semiconductor device, comprising:
   an n-type layer comprising a $Ga_2O_3$ compound semiconductor having an n-type conductivity property; and
   an electrode comprising a Ti layer and formed on the n-type layer.

2. A $Ga_2O_3$ semiconductor device according to claim 1, wherein the electrode includes an Au layer or Pt layer formed on the Ti layer.

3. A $Ga_2O_3$ semiconductor device according to claim 1, wherein the electrode includes an Al layer formed on the Ti layer.

4. A $Ga_2O_3$ semiconductor device according to claim 1, wherein the electrode includes an Al layer formed on the Ti layer, and an Au layer or a Pt layer formed on the Al layer.

5. A $Ga_2O_3$ semiconductor device according to claim 1, wherein the electrode includes an Al layer formed on the Ti layer, a Ni layer formed on the Al layer, and an Au layer or a Pt layer formed on the Ni layer.

6. A method of manufacturing a $Ga_2O_3$ semiconductor device, comprising:
   forming an electrode on an n-type layer comprising a $Ga_2O_3$ compound semiconductor having an n-type conductivity property, wherein the electrode is formed without performing a heat treatment for obtaining ohmic characteristics.

* * * * *